(12) United States Patent
La Fratta et al.

(10) Patent No.: US 10,387,121 B2
(45) Date of Patent: Aug. 20, 2019

(54) APPARATUSES AND METHODS FOR RANDOM NUMBER GENERATION

(71) Applicant: Micron Technology, Inc., Boise, ID (US)

(72) Inventors: Patrick A. La Fratta, Boise, ID (US); Jesse F. Lovitt, Boise, ID (US); Glen E. Hush, Boise, ID (US); Timothy P. Finkbeiner, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/213,835

(22) Filed: Dec. 7, 2018

(65) Prior Publication Data
US 2019/0108000 A1      Apr. 11, 2019

Related U.S. Application Data

(63) Continuation of application No. 15/995,748, filed on Jun. 1, 2018, now Pat. No. 10,152,304, which is a
(Continued)

(51) Int. Cl.
| | |
|---|---|
| *G06F 7/58* | (2006.01) |
| *G11C 7/06* | (2006.01) |
| *G11C 7/10* | (2006.01) |
| *G11C 11/408* | (2006.01) |
| *G11C 11/4091* | (2006.01) |
| *G11C 11/4096* | (2006.01) |

(52) U.S. Cl.
CPC .............. *G06F 7/588* (2013.01); *G11C 7/065* (2013.01); *G11C 7/1006* (2013.01); *G11C 11/4087* (2013.01); *G11C 11/4091* (2013.01); *G11C 11/4096* (2013.01)

(58) Field of Classification Search
CPC .................................................. G06F 7/58–588
USPC .................................................. 708/250–256
See application file for complete search history.

(56) References Cited

U.S. PATENT DOCUMENTS

| | | |
|---|---|---|
| 4,380,046 A | 4/1983 | Fung |
| 4,435,792 A | 3/1984 | Bechtolsheim |
| | (Continued) | |

FOREIGN PATENT DOCUMENTS

| | | |
|---|---|---|
| CN | 102141905 | 8/2011 |
| EP | 0214718 | 3/1987 |
| | (Continued) | |

OTHER PUBLICATIONS

Boyd et al., "On the General Applicability of Instruction-Set Randomization", Jul.-Sep. 2010, (14 pgs.), vol. 7, Issue 3, IEEE Transactions on Dependable and Secure Computing.
(Continued)

*Primary Examiner* — Matthew D Sandifer
(74) *Attorney, Agent, or Firm* — Brooks, Cameron & Huebsch, PLLC

(57) ABSTRACT

The present disclosure includes apparatuses and methods for random number generation. An example method includes operating a sense amplifier of a memory device to perform sensing a first voltage on a first sense line coupled to the sense amplifier and sensing a second voltage on a complementary second sense line coupled to the sense amplifier. The example method further includes generating a random number by detecting a voltage differential between the first sense line and the complementary second sense line.

23 Claims, 7 Drawing Sheets

Related U.S. Application Data continuation of application No. 15/227,459, filed on Aug. 3, 2016, now Pat. No. 9,990,181.

(56) References Cited

U.S. PATENT DOCUMENTS

| | | |
|---|---|---|
| 4,435,793 A | 3/1984 | Ochii |
| 4,727,474 A | 2/1988 | Batcher |
| 4,843,264 A | 6/1989 | Galbraith |
| 4,958,378 A | 9/1990 | Bell |
| 4,977,542 A | 12/1990 | Matsuda et al. |
| 5,023,838 A | 6/1991 | Herbert |
| 5,034,636 A | 7/1991 | Reis et al. |
| 5,201,039 A | 4/1993 | Sakamura |
| 5,210,850 A | 5/1993 | Kelly et al. |
| 5,253,308 A | 10/1993 | Johnson |
| 5,276,643 A | 1/1994 | Hoffmann et al. |
| 5,325,519 A | 6/1994 | Long et al. |
| 5,367,488 A | 11/1994 | An |
| 5,379,257 A | 1/1995 | Matsumura et al. |
| 5,386,379 A | 1/1995 | Ali-Yahia et al. |
| 5,398,213 A | 3/1995 | Yeon et al. |
| 5,440,482 A | 8/1995 | Davis |
| 5,446,690 A | 8/1995 | Tanaka et al. |
| 5,473,576 A | 12/1995 | Matsui |
| 5,481,500 A | 1/1996 | Reohr et al. |
| 5,485,373 A | 1/1996 | Davis et al. |
| 5,506,811 A | 4/1996 | McLaury |
| 5,615,404 A | 3/1997 | Knoll et al. |
| 5,638,128 A | 6/1997 | Hoogenboom |
| 5,638,317 A | 6/1997 | Tran |
| 5,654,936 A | 8/1997 | Cho |
| 5,678,021 A | 10/1997 | Pawate et al. |
| 5,724,291 A | 3/1998 | Matano |
| 5,724,366 A | 3/1998 | Furutani |
| 5,751,987 A | 5/1998 | Mahant-Shetti et al. |
| 5,787,458 A | 7/1998 | Miwa |
| 5,854,636 A | 12/1998 | Watanabe et al. |
| 5,867,429 A | 2/1999 | Chen et al. |
| 5,870,504 A | 2/1999 | Nemoto et al. |
| 5,915,084 A | 6/1999 | Wendell |
| 5,935,263 A | 8/1999 | Keeth et al. |
| 5,986,942 A | 11/1999 | Sugibayashi |
| 5,991,209 A | 11/1999 | Chow |
| 5,991,785 A | 11/1999 | Alidina et al. |
| 6,005,799 A | 12/1999 | Rao |
| 6,009,020 A | 12/1999 | Nagata |
| 6,092,186 A | 7/2000 | Betker et al. |
| 6,122,211 A | 9/2000 | Morgan et al. |
| 6,125,071 A | 9/2000 | Kohno et al. |
| 6,134,164 A | 10/2000 | Lattimore et al. |
| 6,147,514 A | 11/2000 | Shiratake |
| 6,151,244 A | 11/2000 | Fujino et al. |
| 6,157,578 A | 12/2000 | Brady |
| 6,163,862 A | 12/2000 | Adams et al. |
| 6,166,942 A | 12/2000 | Vo et al. |
| 6,172,918 B1 | 1/2001 | Hidaka |
| 6,175,514 B1 | 1/2001 | Henderson |
| 6,181,698 B1 | 1/2001 | Hariguchi |
| 6,208,544 B1 | 3/2001 | Beadle et al. |
| 6,226,215 B1 | 5/2001 | Yoon |
| 6,301,153 B1 | 10/2001 | Takeuchi et al. |
| 6,301,164 B1 | 10/2001 | Manning et al. |
| 6,304,477 B1 | 10/2001 | Naji |
| 6,389,507 B1 | 5/2002 | Sherman |
| 6,418,498 B1 | 7/2002 | Martwick |
| 6,466,499 B1 | 10/2002 | Blodgett |
| 6,510,098 B1 | 1/2003 | Taylor |
| 6,563,754 B1 | 5/2003 | Lien et al. |
| 6,578,058 B1 | 6/2003 | Nygaard |
| 6,731,542 B1 | 5/2004 | Le et al. |
| 6,754,746 B1 | 6/2004 | Leung et al. |
| 6,768,679 B1 | 7/2004 | Le et al. |
| 6,807,614 B2 | 10/2004 | Chung |
| 6,816,422 B2 | 11/2004 | Hamade et al. |
| 6,819,612 B1 | 11/2004 | Achter |
| 6,894,549 B2 | 5/2005 | Eliason |
| 6,943,579 B1 | 9/2005 | Hazanchuk et al. |
| 6,948,056 B1 | 9/2005 | Roth et al. |
| 6,950,771 B1 | 9/2005 | Fan et al. |
| 6,950,898 B2 | 9/2005 | Merritt et al. |
| 6,956,770 B2 | 10/2005 | Khalid et al. |
| 6,961,272 B2 | 11/2005 | Schreck |
| 6,965,648 B1 | 11/2005 | Smith et al. |
| 6,985,394 B2 | 1/2006 | Kim |
| 6,987,693 B2 | 1/2006 | Cernea et al. |
| 7,020,017 B2 | 3/2006 | Chen et al. |
| 7,028,170 B2 | 4/2006 | Saulsbury |
| 7,045,834 B2 | 5/2006 | Tran et al. |
| 7,054,178 B1 | 5/2006 | Shiah et al. |
| 7,061,817 B2 | 6/2006 | Raad et al. |
| 7,079,407 B1 | 7/2006 | Dimitrelis |
| 7,173,857 B2 | 2/2007 | Kato et al. |
| 7,187,585 B2 | 3/2007 | Li et al. |
| 7,196,928 B2 | 3/2007 | Chen |
| 7,260,565 B2 | 8/2007 | Lee et al. |
| 7,260,672 B2 | 8/2007 | Garney |
| 7,372,715 B2 | 5/2008 | Han |
| 7,400,532 B2 | 7/2008 | Aritome |
| 7,406,494 B2 | 7/2008 | Magee |
| 7,447,720 B2 | 11/2008 | Beaumont |
| 7,454,451 B2 | 11/2008 | Beaumont |
| 7,457,181 B2 | 11/2008 | Lee et al. |
| 7,535,769 B2 | 5/2009 | Cernea |
| 7,546,438 B2 | 6/2009 | Chung |
| 7,562,198 B2 | 7/2009 | Noda et al. |
| 7,574,466 B2 | 8/2009 | Beaumont |
| 7,602,647 B2 | 10/2009 | Li et al. |
| 7,663,928 B2 | 2/2010 | Tsai et al. |
| 7,685,365 B2 | 3/2010 | Rajwar et al. |
| 7,692,466 B2 | 4/2010 | Ahmadi |
| 7,752,417 B2 | 7/2010 | Manczak et al. |
| 7,791,962 B2 | 9/2010 | Noda et al. |
| 7,796,453 B2 | 9/2010 | Riho et al. |
| 7,805,587 B1 | 9/2010 | Van Dyke et al. |
| 7,808,854 B2 | 10/2010 | Takase |
| 7,827,372 B2 | 11/2010 | Bink et al. |
| 7,869,273 B2 | 1/2011 | Lee et al. |
| 7,898,864 B2 | 3/2011 | Dong |
| 7,924,628 B2 | 4/2011 | Danon et al. |
| 7,937,535 B2 | 5/2011 | Ozer et al. |
| 7,957,206 B2 | 6/2011 | Bauser |
| 7,979,667 B2 | 7/2011 | Allen et al. |
| 7,996,749 B2 | 8/2011 | Ding et al. |
| 8,042,082 B2 | 10/2011 | Solomon |
| 8,045,391 B2 | 10/2011 | Mohklesi |
| 8,059,438 B2 | 11/2011 | Chang et al. |
| 8,095,825 B2 | 1/2012 | Hirotsu et al. |
| 8,117,462 B2 | 2/2012 | Snapp et al. |
| 8,164,942 B2 | 4/2012 | Gebara et al. |
| 8,208,328 B2 | 6/2012 | Hong |
| 8,213,248 B2 | 7/2012 | Moon et al. |
| 8,223,568 B2 | 7/2012 | Seo |
| 8,238,173 B2 | 8/2012 | Akerib et al. |
| 8,274,841 B2 | 9/2012 | Shimano et al. |
| 8,279,683 B2 | 10/2012 | Klein |
| 8,310,884 B2 | 11/2012 | Iwai et al. |
| 8,332,367 B2 | 12/2012 | Bhattacherjee et al. |
| 8,339,824 B2 | 12/2012 | Cooke |
| 8,339,883 B2 | 12/2012 | Yu et al. |
| 8,347,154 B2 | 1/2013 | Bahali et al. |
| 8,351,292 B2 | 1/2013 | Matano |
| 8,356,144 B2 | 1/2013 | Hessel et al. |
| 8,417,921 B2 | 4/2013 | Gonion et al. |
| 8,462,532 B1 | 6/2013 | Argyres |
| 8,484,276 B2 | 7/2013 | Carlson et al. |
| 8,495,438 B2 | 7/2013 | Roine |
| 8,503,250 B2 | 8/2013 | Demone |
| 8,526,239 B2 | 9/2013 | Kim |
| 8,533,245 B1 | 9/2013 | Cheung |
| 8,555,037 B2 | 10/2013 | Gonion |
| 8,599,613 B2 | 12/2013 | Abiko et al. |
| 8,605,015 B2 | 12/2013 | Guttag et al. |
| 8,625,376 B2 | 1/2014 | Jung et al. |
| 8,644,101 B2 | 2/2014 | Jun et al. |

(56) References Cited

U.S. PATENT DOCUMENTS

| | | | |
|---|---|---|---|
| 8,650,232 | B2 | 2/2014 | Stortz et al. |
| 8,873,272 | B2 | 10/2014 | Lee |
| 8,964,496 | B2 | 2/2015 | Manning |
| 8,971,124 | B1 | 3/2015 | Manning |
| 8,976,586 | B2 | 3/2015 | Nagai et al. |
| 9,015,390 | B2 | 4/2015 | Klein |
| 9,047,193 | B2 | 6/2015 | Lin et al. |
| 9,165,023 | B2 | 10/2015 | Moskovich et al. |
| 9,218,159 | B2 | 12/2015 | Seol et al. |
| 2001/0007112 | A1 | 7/2001 | Porterfield |
| 2001/0008492 | A1 | 7/2001 | Higashiho |
| 2001/0010057 | A1 | 7/2001 | Yamada |
| 2001/0028584 | A1 | 10/2001 | Nakayama et al. |
| 2001/0043089 | A1 | 11/2001 | Forbes et al. |
| 2002/0059355 | A1 | 5/2002 | Peleg et al. |
| 2003/0167426 | A1 | 9/2003 | Slobodnik |
| 2003/0222879 | A1 | 12/2003 | Lin et al. |
| 2004/0073592 | A1 | 4/2004 | Kim et al. |
| 2004/0073773 | A1 | 4/2004 | Demjanenko |
| 2004/0085840 | A1 | 5/2004 | Vali et al. |
| 2004/0095826 | A1 | 5/2004 | Perner |
| 2004/0154002 | A1 | 8/2004 | Ball et al. |
| 2004/0205289 | A1 | 10/2004 | Srinivasan |
| 2004/0240251 | A1 | 12/2004 | Nozawa et al. |
| 2005/0015557 | A1 | 1/2005 | Wang et al. |
| 2005/0078514 | A1 | 4/2005 | Scheuerlein et al. |
| 2005/0097417 | A1 | 5/2005 | Agrawal et al. |
| 2006/0047937 | A1 | 3/2006 | Selvaggi et al. |
| 2006/0069849 | A1 | 3/2006 | Rudelic |
| 2006/0146623 | A1 | 7/2006 | Mizuno et al. |
| 2006/0149804 | A1 | 7/2006 | Luick et al. |
| 2006/0181917 | A1 | 8/2006 | Kang et al. |
| 2006/0215432 | A1 | 9/2006 | Wickeraad et al. |
| 2006/0225072 | A1 | 10/2006 | Lari et al. |
| 2006/0291282 | A1 | 12/2006 | Liu et al. |
| 2007/0103986 | A1 | 5/2007 | Chen |
| 2007/0171747 | A1 | 7/2007 | Hunter et al. |
| 2007/0180006 | A1 | 8/2007 | Gyoten et al. |
| 2007/0180184 | A1 | 8/2007 | Sakashita et al. |
| 2007/0195602 | A1 | 8/2007 | Fong et al. |
| 2007/0285131 | A1 | 12/2007 | Sohn |
| 2007/0285979 | A1 | 12/2007 | Turner |
| 2007/0291532 | A1 | 12/2007 | Tsuji |
| 2008/0025073 | A1 | 1/2008 | Arsovski |
| 2008/0037333 | A1 | 2/2008 | Kim et al. |
| 2008/0052711 | A1 | 2/2008 | Forin et al. |
| 2008/0137388 | A1 | 6/2008 | Krishnan et al. |
| 2008/0165601 | A1 | 7/2008 | Matick et al. |
| 2008/0178053 | A1 | 7/2008 | Gorman et al. |
| 2008/0215937 | A1 | 9/2008 | Dreibelbis et al. |
| 2009/0067218 | A1 | 3/2009 | Graber |
| 2009/0154238 | A1 | 6/2009 | Lee |
| 2009/0154273 | A1 | 6/2009 | Borot et al. |
| 2009/0165086 | A1 | 6/2009 | Trichina et al. |
| 2009/0254697 | A1 | 10/2009 | Akerib |
| 2010/0067296 | A1 | 3/2010 | Li |
| 2010/0091582 | A1 | 4/2010 | Vali et al. |
| 2010/0172190 | A1 | 7/2010 | Lavi et al. |
| 2010/0210076 | A1 | 8/2010 | Gruber et al. |
| 2010/0226183 | A1 | 9/2010 | Kim |
| 2010/0308858 | A1 | 12/2010 | Noda et al. |
| 2010/0332895 | A1 | 12/2010 | Billing et al. |
| 2011/0051523 | A1 | 3/2011 | Manabe et al. |
| 2011/0063919 | A1 | 3/2011 | Chandrasekhar et al. |
| 2011/0093662 | A1 | 4/2011 | Walker et al. |
| 2011/0103151 | A1 | 5/2011 | Kim et al. |
| 2011/0119467 | A1 | 5/2011 | Cadambi et al. |
| 2011/0122695 | A1 | 5/2011 | Li et al. |
| 2011/0140741 | A1 | 6/2011 | Zerbe et al. |
| 2011/0219260 | A1 | 9/2011 | Nobunaga et al. |
| 2011/0267883 | A1 | 11/2011 | Lee et al. |
| 2011/0317496 | A1 | 12/2011 | Bunce et al. |
| 2012/0005397 | A1 | 1/2012 | Lim et al. |
| 2012/0017039 | A1 | 1/2012 | Margetts |
| 2012/0023281 | A1 | 1/2012 | Kawasaki et al. |
| 2012/0120705 | A1 | 5/2012 | Mitsubori et al. |
| 2012/0134216 | A1 | 5/2012 | Singh |
| 2012/0134225 | A1 | 5/2012 | Chow |
| 2012/0134226 | A1 | 5/2012 | Chow |
| 2012/0140540 | A1 | 6/2012 | Agam et al. |
| 2012/0182798 | A1 | 7/2012 | Hosono et al. |
| 2012/0195146 | A1 | 8/2012 | Jun et al. |
| 2012/0198310 | A1 | 8/2012 | Tran et al. |
| 2012/0246380 | A1 | 9/2012 | Akerib et al. |
| 2012/0265964 | A1 | 10/2012 | Murata et al. |
| 2012/0281486 | A1 | 11/2012 | Rao et al. |
| 2012/0303627 | A1 | 11/2012 | Keeton et al. |
| 2013/0003467 | A1 | 1/2013 | Klein |
| 2013/0061006 | A1 | 3/2013 | Hein |
| 2013/0107623 | A1 | 5/2013 | Kavalipurapu et al. |
| 2013/0117541 | A1 | 5/2013 | Choquette et al. |
| 2013/0124783 | A1 | 5/2013 | Yoon et al. |
| 2013/0132702 | A1 | 5/2013 | Patel et al. |
| 2013/0138646 | A1 | 5/2013 | Sirer et al. |
| 2013/0163362 | A1 | 6/2013 | Kim |
| 2013/0173888 | A1 | 7/2013 | Hansen et al. |
| 2013/0205114 | A1 | 8/2013 | Badam et al. |
| 2013/0219112 | A1 | 8/2013 | Okin et al. |
| 2013/0227361 | A1 | 8/2013 | Bowers et al. |
| 2013/0283122 | A1 | 10/2013 | Anholt et al. |
| 2013/0286705 | A1 | 10/2013 | Grover et al. |
| 2013/0326154 | A1 | 12/2013 | Haswell |
| 2013/0332707 | A1 | 12/2013 | Gueron et al. |
| 2014/0185395 | A1 | 7/2014 | Seo |
| 2014/0215185 | A1 | 7/2014 | Danielsen |
| 2014/0250279 | A1 | 9/2014 | Manning |
| 2014/0344934 | A1 | 11/2014 | Jorgensen |
| 2015/0029798 | A1 | 1/2015 | Manning |
| 2015/0042380 | A1 | 2/2015 | Manning |
| 2015/0063052 | A1 | 3/2015 | Manning |
| 2015/0078108 | A1 | 3/2015 | Cowles et al. |
| 2015/0120987 | A1 | 4/2015 | Wheeler |
| 2015/0134713 | A1 | 5/2015 | Wheeler |
| 2015/0270015 | A1 | 9/2015 | Murphy et al. |
| 2015/0279466 | A1 | 10/2015 | Manning |
| 2015/0324290 | A1 | 11/2015 | Leidel |
| 2015/0325272 | A1 | 11/2015 | Murphy |
| 2015/0355886 | A1 | 12/2015 | Peeters et al. |
| 2015/0356009 | A1 | 12/2015 | Wheeler et al. |
| 2015/0356022 | A1 | 12/2015 | Leidel et al. |
| 2015/0357007 | A1 | 12/2015 | Manning et al. |
| 2015/0357008 | A1 | 12/2015 | Manning et al. |
| 2015/0357019 | A1 | 12/2015 | Wheeler et al. |
| 2015/0357020 | A1 | 12/2015 | Manning |
| 2015/0357021 | A1 | 12/2015 | Hush |
| 2015/0357022 | A1 | 12/2015 | Hush |
| 2015/0357023 | A1 | 12/2015 | Hush |
| 2015/0357024 | A1 | 12/2015 | Hush et al. |
| 2015/0357047 | A1 | 12/2015 | Tiwari |
| 2016/0062672 | A1 | 3/2016 | Wheeler |
| 2016/0062673 | A1 | 3/2016 | Tiwari |
| 2016/0062692 | A1 | 3/2016 | Finkbeiner et al. |
| 2016/0062733 | A1 | 3/2016 | Tiwari |
| 2016/0063284 | A1 | 3/2016 | Tiwari |
| 2016/0064045 | A1 | 3/2016 | La Fratta |
| 2016/0064047 | A1 | 3/2016 | Tiwari |
| 2016/0098208 | A1 | 4/2016 | Willcock |
| 2016/0098209 | A1 | 4/2016 | Leidel et al. |
| 2016/0110135 | A1 | 4/2016 | Wheeler et al. |
| 2016/0125919 | A1 | 5/2016 | Hush |
| 2016/0154596 | A1 | 6/2016 | Willcock et al. |
| 2016/0155482 | A1 | 6/2016 | La Fratta |
| 2016/0188250 | A1 | 6/2016 | Wheeler |
| 2016/0196142 | A1 | 7/2016 | Wheeler et al. |
| 2016/0196856 | A1 | 7/2016 | Tiwari et al. |
| 2016/0202953 | A1 | 7/2016 | Chen et al. |
| 2016/0225422 | A1 | 8/2016 | Tiwari et al. |
| 2017/0277459 | A1 | 9/2017 | Rodriguez et al. |

FOREIGN PATENT DOCUMENTS

| | | |
|---|---|---|
| EP | 2026209 | 2/2009 |
| JP | H0831168 | 2/1996 |
| JP | 2009259193 | 3/2015 |

(56) References Cited

FOREIGN PATENT DOCUMENTS

| KR | 10-0211482 | 8/1998 |
|---|---|---|
| KR | 10-2010-0134235 | 12/2010 |
| KR | 10-2013-0049421 | 5/2013 |
| WO | 2001065359 | 9/2001 |
| WO | 2010079451 | 7/2010 |
| WO | 2013062596 | 5/2013 |
| WO | 2013081588 | 6/2013 |
| WO | 2013095592 | 6/2013 |

OTHER PUBLICATIONS

Stojmenovic, "Multiplicative Circulant Networks Topological Properties and Communication Algorithms", (25 pgs.), Discrete Applied Mathematics 77 (1997) 281-305.

"4.9.3 MINLOC and MAXLOC", Jun. 12, 1995, (5pgs.), Message Passing Interface Forum 1.1, retrieved from http://www.mpi-forum.org/docs/mpi-1.1/mpi-11-html/node79.html.

Derby, et al., "A High-Performance Embedded DSP Core with Novel SIMD Features", Apr. 6-10, 2003, (4 pgs), vol. 2, pp. 301-304, 2003 IEEE International Conference on Accoustics, Speech, and Signal Processing.

Debnath, Biplob, Bloomflash: Bloom Filter on Flash-Based Storage, 2011 31st Annual Conference on Distributed Computing Systems, Jun. 20-24, 2011, 10 pgs.

Pagiamtzis, Kostas, "Content-Addressable Memory Introduction", Jun. 25, 2007, (6 pgs.), retrieved from: http://www.pagiamtzis.com/cam/camintro.

Pagiamtzis, et al., "Content-Addressable Memory (CAM) Circuits and Architectures: A Tutorial and Survey", Mar. 2006, (16 pgs.), vol. 41, No. 3, IEEE Journal of Solid-State Circuits.

International Search Report and Written Opinion for PCT Application No. PCT/US2013/043702, dated Sep. 26, 2013, (11 pgs.).

Elliot, et al., "Computational RAM: Implementing Processors in Memory", Jan.-Mar. 1999, (10 pgs.), vol. 16, Issue 1, IEEE Design and Test of Computers Magazine.

Dybdahl, et al., "Destructive-Read in Embedded DRAM, Impact on Power Consumption," Apr. 2006, (10 pgs.), vol. 2, Issue 2, Journal of Embedded Computing-Issues in embedded single-chip multicore architectures.

Kogge, et al., "Processing in Memory: Chips to Petaflops," May 23, 1997, (8 pgs.), retrieved from: http://www.cs.ucf.edu/courses/cda5106/summer02/papers/kogge97PIM.pdf.

Draper, et al., "The Architecture of the DIVA Processing-In-Memory Chip," Jun. 22-26, 2002, (12 pgs.), ICS '02, retrieved from: http://www.isi.edu/~draper/papers/ics02.pdf.

Adibi, et al., "Processing-In-Memory Technology for Knowledge Discovery Algorithms," Jun. 25, 2006, (10 pgs.), Proceeding of the Second International Workshop on Data Management on New Hardware, retrieved from: http://www.cs.cmu.edu/~damon2006/pdf/adibi06inmemory.pdf.

U.S. Appl. No. 13/449,082, entitled, "Methods and Apparatus for Pattern Matching," filed Apr. 17, 2012, (37 pgs.).

U.S. Appl. No. 13/743,686, entitled, "Weighted Search and Compare in a Memory Device," filed Jan. 17, 2013, (25 pgs.).

U.S. Appl. No. 13/774,636, entitled, "Memory As a Programmable Logic Device," filed Feb. 22, 2013, (30 pgs.).

U.S. Appl. No. 13/774,553, entitled, "Neural Network in a Memory Device," filed Feb. 22, 2013, (63 pgs.).

U.S. Appl. No. 13/796,189, entitled, "Performing Complex Arithmetic Functions in a Memory Device," filed Mar. 12, 2013, (23 pgs.).

US 10,387,121 B2

APPARATUSES AND METHODS FOR RANDOM NUMBER GENERATION

PRIORITY INFORMATION

This application is a Continuation of U.S. application Ser. No. 15/995,748, filed Jun. 1, 2018, which issues as U.S. Pat. No. 10,152,304 on Dec. 11, 2018, which is a Continuation of U.S. application Ser. No. 15/227,459, filed Aug. 3, 2016, which issued as U.S. Pat. No. 9,990,181 on Jun. 5, 2018, the contents of which are incorporated herein by reference.

TECHNICAL FIELD

The present disclosure relates generally to semiconductor memory and methods, and more particularly, to apparatuses and methods for random number generation.

BACKGROUND

Memory devices are typically provided as internal, semiconductor, integrated circuits in computers or other electronic systems. There are many different types of memory including volatile and non-volatile memory. Volatile memory can require power to maintain its data (e.g., host data, error data, etc.) and includes random access memory (RAM), dynamic random access memory (DRAM), static random access memory (SRAM), synchronous dynamic random access memory (SDRAM), and thyristor random access memory (TRAM), among others. Non-volatile memory can provide persistent data by retaining stored data when not powered and can include NAND flash memory, NOR flash memory, and resistance variable memory such as phase change random access memory (PCRAM), resistive random access memory (RRAM), and magnetoresistive random access memory (MRAM), such as spin torque transfer random access memory (STT RAM), among others.

Electronic systems often include a number of processing resources (e.g., one or more processors), which may retrieve and execute instructions and store the results of the executed instructions to a suitable location. A processor can comprise a number of functional units such as arithmetic logic unit (ALU) circuitry, floating point unit (FPU) circuitry, and a combinatorial logic block, for example, which can be used to execute instructions by performing an operation on data (e.g., one or more operands). As used herein, an operation can be, for example, a Boolean operation, such as AND, OR, NOT, NOT, NAND, NOR, and XOR, and/or other operations (e.g., invert, shift, arithmetic, statistics, among many other possible operations). For example, functional unit circuitry may be used to perform the arithmetic operations, such as addition, subtraction, multiplication, and division on operands, via a number of logical operations.

A number of components in an electronic system may be involved in providing instructions to the functional unit circuitry for execution. The instructions may be executed, for instance, by a processing resource such as a controller and host processor. Data (e.g., the operands on which the instructions will be executed) may be stored in a memory array that is accessible by the functional unit circuitry. The instructions and data may be retrieved from the memory array and sequenced and buffered before the functional unit circuitry begins to execute instructions on the data. Furthermore, as different types of operations may be performed in one or multiple clock cycles through the functional unit circuitry, intermediate results of the instructions and data may also be sequenced and buffered.

In many instances, the processing resources (e.g., processor and associated functional unit circuitry) may be external to the memory array, and data is accessed via a bus between the processing resources and the memory array to execute a set of instructions. Processing performance may be improved in a processing in memory device, in which a processor may be implemented internally and near to a memory (e.g., directly on a same chip as the memory array). A processing in memory device may save time by reducing and eliminating external communications and may also conserve power. However, the potential for other functions, such as read and write operations, being performed in addition to processing operations may influence the data processing time of the processing in memory device.

DETAILED DESCRIPTION

Figure 1A:
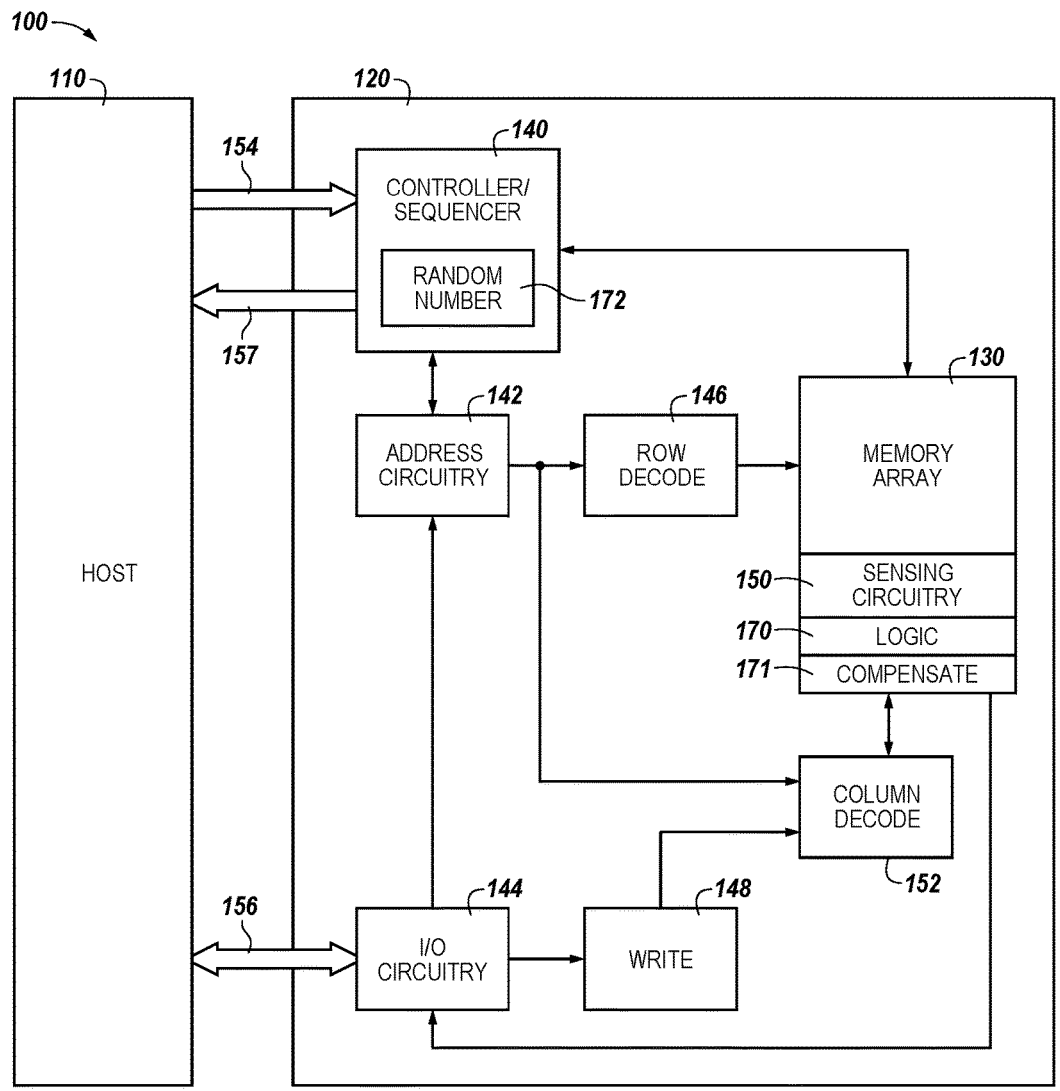
FIG. 1A is a block diagram of an apparatus in the form of a computing system including a memory device in accordance with a number of embodiments of the present disclosure.

The present disclosure includes apparatuses and methods for random number generation (e.g., for use with a memory device having DRAM, among other types of memory). In at least one embodiment, a method includes operating the memory device for random number generation by operating a sense amplifier of a memory device to perform sensing a first voltage on a first sense line coupled to the sense amplifier and sensing a second voltage on a complementary second sense line coupled to the sense amplifier. The example method further includes generating a random number by detecting a voltage differential between the first sense line and the complementary second sense line.

One of the objectives of random number generation may be that an output of a random number generation algorithm is not determined by a programmer and/or is not predictable based on underlying parameters of the algorithm itself. Random numbers have a variety of uses. Examples of applications that may use random number samples can include reducing aggregated error in applications where rounding is necessary, application of probabilistic models to make predictions based thereon, sampling values from probability densities, simulating stochastic processes, such as behavior of materials or financial markets, performing Monte Carlo simulations to approximate difficult to compute values, or adding additional security to passwords and encryption keys, among other applications.

A repeated use of one or more "random numbers" could introduce unwanted correlations and/or predictability that undermine the true randomness of such numbers. To contribute to true randomness, a source of a large number of statistically independent numbers (random numbers) may be utilized, as described herein. The statistical independence of the random numbers may be based upon a voltage differential sensed as a residual voltage at each of a pair of memory cells (e.g., complementary memory cells, as described herein). Residual voltage is intended to mean a voltage in a sense line for a memory cell that is in an unprogrammed logic state. Being in the unprogrammed logic state may mean that neither of the pair of memory cells has been programed to store a voltage associated with a data value (e.g., both memory cells remaining near 0.0 volts (V)) and/or that the pair of memory cells has been equilibrated to erase a stored data value (e.g., by bringing both of the memory cells and the respective sense lines to $V_{DD}/2$, where $V_{DD}$ is a supply voltage associated with the array). The randomness of the differential may be based upon the physics of thermal noise conferring randomness to a value of the residual voltage at each of the paired memory cells.

In various embodiments, an apparatus, as described herein, may enable a large number of random numbers of various lengths to be generated. For example, random numbers of various lengths may be generated by splitting a vector of random data units, which may correspond to a length of a row of memory cells, to generate a plurality of vector elements. Different random numbers may be generated with passage of time by, for example, sequentially sampling the residual voltage differential at the paired memory cells such that the thermal noise causes random variance of the residual voltage differential over time.

In some embodiments, random number generation may be performed by a sense operation on an equilibrated first sense line and on an equilibrated second complementary sense line, for example, for a respective pair of memory cell in the unprogrammed logic state and/or the equilibrated state. The random number generation can be performed by determination of a differential between the first residual voltage sensed on the equilibrated first sense line and the second residual voltage sensed on the equilibrated second sense line. In various embodiments, random numbers may be generated by sensing the first residual voltage on the first sense line and sensing the second residual voltage on the second sense line, where the sense lines may be equilibrated.

In some memory devices (e.g., memory devices having a DRAM architecture, as described herein), the same memory array may be used for both random number generation and other logical operations (e.g., DRAM read, write, copy, and/or erase operations, among others). Performance of these two types of operations may utilize shared resources, for example, sense amplifiers and/or equilibrate circuitry in the sensing circuitry described herein. In some embodiments, processing in memory (PIM) logical operations (e.g., computation operations such as Boolean operations, among others) may be performed in the same memory array, for example, by a compute component coupled to the sense amplifier, as described herein.

In some DRAM implementations, the sensing circuitry (e.g., the sense amplifiers and/or compute components therein) may be equilibrated by the equilibrate circuitry following completion of a DRAM and/or PIM operation and/or prior to performance of a random number generation operation. The equilibration may be performed so that the sensing circuitry is prepared to receive different data values for a next DRAM and/or PIM operation and/or to place the complementary sense lines in the memory array in the equilibrated state in preparation for sensing residual voltage on the sense lines by a sense amplifier to generate the random number.

As described in more detail below, the embodiments can allow a host system to allocate a number of locations (e.g., sub-arrays (or "subarrays")) and portions of subarrays, in one or more DRAM banks to hold (e.g., store) and/or process data. A host system and a controller may perform the address resolution on an entire block of program instructions (e.g., command instructions) and data and direct (e.g., control) allocation, storage, and/or movement (e.g., flow) of data and commands into allocated locations (e.g., subarrays and portions of subarrays) within a destination (e.g., target) bank. Executing some commands, for example, for performing DRAM write and/or read operations and/or for performing random number generation, as described herein, may utilize some of the normal DRAM signaling paths to the DRAM device.

Figure 2A:
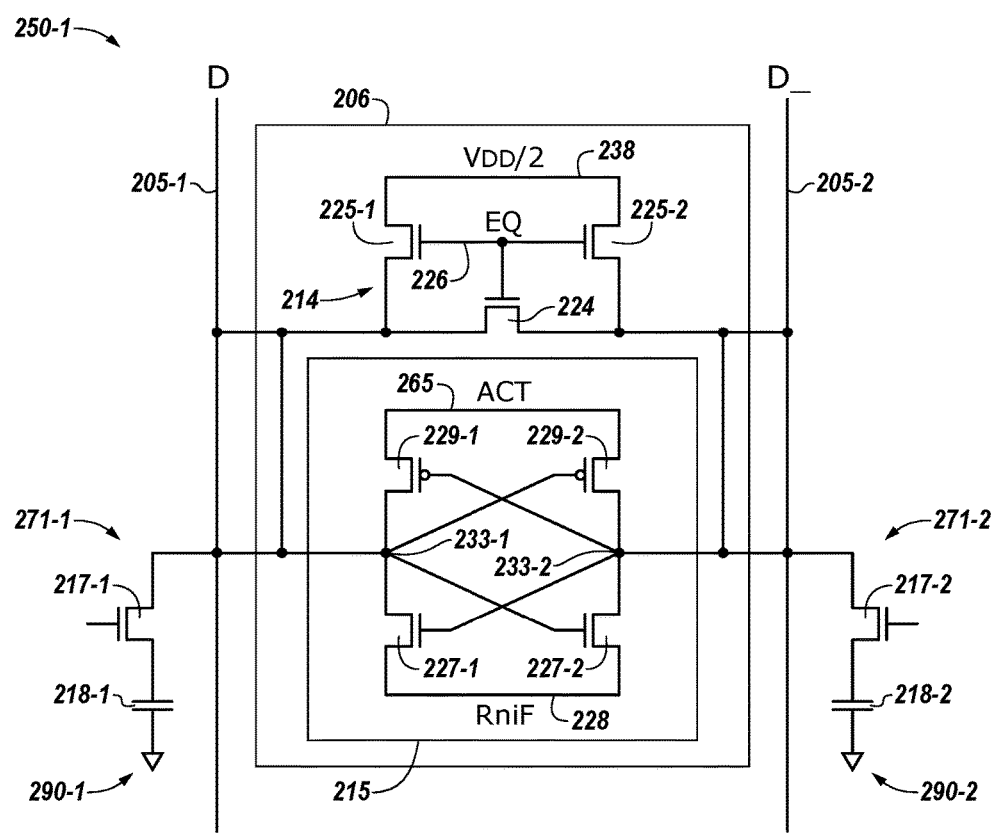
FIGS. 2A-2B are schematic diagrams illustrating sensing circuitry in accordance with a number of embodiments of the present disclosure.

In contrast, executing other commands may utilize signaling paths particular to performing the random number generation, such as the random number component 172 and the compensate circuitry 171 illustrated in FIG. 1A and the corresponding compensate circuitry 271 illustrated in more detail in FIG. 2A. As the reader will appreciate, while a DRAM bit vector operation (e.g., PIM) device is discussed with regard to some examples presented herein, embodiments are not limited to a PIM DRAM implementation.

In the following detailed description of the present disclosure, reference is made to the accompanying drawings that form a part hereof, and in which is shown by way of illustration how one or more embodiments of the disclosure may be practiced. These embodiments are described in sufficient detail to enable those of ordinary skill in the art to practice the embodiments of this disclosure, and it is to be understood that other embodiments may be utilized and that process, electrical, and structural changes may be made without departing from the scope of the present disclosure.

As used herein, designators such as "X", "Y", "N", "M", etc., particularly with respect to reference numerals in the drawings, indicate that a number of the particular feature so designated can be included. It is also to be understood that the terminology used herein is for the purpose of describing particular embodiments only, and is not intended to be limiting. As used herein, the singular forms "a", "an", and "the" can include both singular and plural referents, unless the context clearly dictates otherwise. In addition, "a number of", "at least one", and "one or more" (e.g., a number of memory arrays) can refer to one or more memory arrays, whereas a "plurality of" is intended to refer to more than one of such things. Furthermore, the words "can" and "may" are used throughout this application in a permissive sense (i.e., having the potential to, being able to), not in a mandatory sense (i.e., must). The term "include," and derivations thereof, means "including, but not limited to". The terms "coupled" and "coupling" mean to be directly or indirectly connected physically or for access to and movement (transmission) of commands and/or data, as appropriate to the context. The terms "data", "data units", and "data values" are used interchangeably herein and can have the same meaning, as appropriate to the context.

The figures herein follow a numbering convention in which the first digit or digits correspond to the figure number and the remaining digits identify an element or component in the figure. Similar elements or components between different figures may be identified by the use of similar digits. For example, 108 may reference element "08" in FIG. 1A, and a similar element may be referenced as 208 in FIG. 2A. As will be appreciated, elements shown in the various embodiments herein can be added, exchanged, and/or eliminated so as to provide a number of additional embodiments of the present disclosure. In addition, the proportion and/or the relative scale of the elements provided in the figures are intended to illustrate certain embodiments of the present disclosure and should not be taken in a limiting sense.

FIG. 1A is a block diagram of an apparatus in the form of a computing system 100 including a memory device 120 in accordance with a number of embodiments of the present disclosure. As used herein, a memory device 120, controller/sequencer 140, random number component 172, memory array 130, sensing circuitry 150, logic 170, and/or compensate component 171 might also be separately considered an "apparatus."

In previous approaches, data may be transferred from a memory array and sensing circuitry (e.g., via a bus comprising input/output (I/O) lines) to a processing resource such as a processor, microprocessor, and/or compute engine, which may comprise ALU circuitry and/or other functional unit circuitry configured to perform the appropriate operations. However, transferring data from the memory array and sensing circuitry to such processing resource(s) can involve significant time and/or power consumption. Even if the processing resource is located on a same chip as the memory array, significant power can be consumed in moving data out of the array to the compute circuitry, which can involve performing a sense line (which may be referred to herein as a digit line or data line) address access (e.g., firing of a column decode signal) in order to transfer data from sense lines onto I/O lines (e.g., local I/O lines), transferring the data peripheral to the array, which may be transferred to a cache in a host, and providing the data to the peripheral compute circuitry.

Furthermore, the circuitry of the processing resource(s) (e.g., a compute engine) may not conform to pitch rules associated with a memory array. For example, the memory cells of a memory array may have a $4F^2$ or $6F^2$ cell size, where "F" is a feature size corresponding to the cells. As such, the devices (e.g., logic gates) associated with ALU circuitry of previous PIM systems may not be capable of being formed on pitch with the memory cells, which can affect chip size and/or memory density, for example. A number of embodiments of the present disclosure can include the control circuitry and/or the sensing circuitry (e.g., including sense amplifiers and/or compute components), as described herein, being formed on pitch with the memory cells of the array and being configured to (e.g., being capable of performing) compute functions (e.g., operations), such as those described herein, on pitch with the memory cells. The sensing circuitry can, in some embodiments, be capable of performing data sensing and compute functions and at least temporary storage (e.g., caching) of data local to the array of memory cells.

In order to appreciate the performance of operations described herein, a discussion of an apparatus for implementing such techniques follows. For example, such an apparatus may be a memory device having PIM capabilities and an associated host, although embodiments are not limited to memory devices having PIM capabilities. As such, in some embodiments, program instructions (e.g., PIM commands) involving a memory device having PIM capabilities can distribute implementation of the PIM commands and data over multiple sensing circuitries that can implement operations and can move and store the PIM commands and data within the memory array (e.g., without having to transfer such back and forth over an A/C and data bus between a host and the memory device). Thus, data for a memory device having PIM capabilities can be accessed and used in less time and/or using less power. For example, a time and power advantage can be realized by increasing the speed, rate, and/or efficiency of data being moved around and stored in a computing system in order to process requested memory array operations. Such operations may include logical operations, such as reads and/or writes, etc., as DRAM operations and/or PIM operations, such as logical Boolean operations, data movement operations, etc., in addition to random number generation operations, among others described herein.

The system 100 illustrated in FIG. 1A can include a host 110 coupled (e.g., connected) to memory device 120, which includes the memory array 130. Host 110 can be a host system such as a personal laptop computer, a desktop computer, a tablet computer, a digital camera, a smart phone, or a memory card reader, among various other types of hosts. Host 110 can include a system motherboard and backplane and can include a number of processing resources (e.g., one or more processors, microprocessors, or some other type of controlling circuitry). The system 100 can include separate integrated circuits or both the host 110 and the memory device 120 can be on the same integrated circuit. The system 100 can be, for instance, a server system and/or a high performance computing (HPC) system or a portion of either. Although the example shown in FIG. 1A illustrates a system having a Von Neumann architecture, embodiments of the present disclosure can be implemented in non-Von Neumann architectures, which may not include one or more components (e.g., CPU, ALU, etc.) often associated with a Von Neumann architecture.

For clarity, description of the system 100 has been simplified to focus on features with particular relevance to the present disclosure. For example, in various embodiments, the memory array 130 can be a DRAM array, SRAM array, STT RAM array, PCRAM array, TRAM array, RRAM array, NAND flash array, and NOR flash array, for instance. The memory array 130 can include memory cells arranged in rows coupled by access lines (which may be referred to herein as word lines or select lines) and columns coupled by sense lines (which may be referred to herein as data lines or digit lines). Although a single memory array 130 is shown in FIG. 1A, embodiments are not so limited. For instance, memory device 120 may include a number of memory arrays 130 (e.g., a number of banks of DRAM cells, NAND flash cells, etc.) in addition to a number of subarrays, as described herein.

The memory device 120 can include address circuitry 142 to latch address signals provided over a data bus 156 (e.g., an I/O bus from the host 110) by I/O circuitry 144 (e.g., provided to external ALU circuitry and to DRAM DQs via local I/O lines and global I/O lines). As used herein, DRAM DQs can enable input of data to and output of data from a bank (e.g., from and/or to the controller 140 and/or host 110) via a bus (e.g., data bus 156). During a write operation, a voltage (high=1, low=0) can be applied to a DQ (e.g., a pin). This voltage can be translated into an appropriate signal and stored in a selected memory cell. During a read operation, a data value read from a selected memory cell can appear at the DQ once access is complete and the output is enabled (e.g., by the output enable signal being low). At other times, DQs can be in a high impedance state, such that the DQs do not source or sink current and do not present a signal to the system. This also may reduce DQ contention when two or more devices (e.g., banks) share the data bus.

Status and exception information can be provided from the controller 140 on the memory device 120 to the host 110 through, for example, a high speed interface (HSI) out-of-band (OOB) bus 157. The bus 157 can be used by the host 110 to dispatch commands (e.g., PIM commands) to a plurality of memory devices 120-1, . . . , 120-N (not shown) to store those program instructions within a given bank of a memory device.

Address signals are received through address circuitry 142 and decoded by a row decoder 146 and a column decoder 152 to access the memory array 130. Data can be sensed (read) from memory array 130 by sensing voltage and/or current changes on sense lines (digit lines in FIGS. 2A-2B and 3), for example, using a number of sense amplifiers of the sensing circuitry 150. A sense amplifier can read and latch data values from a page (e.g., a row) of data from the memory array 130. Additional compute components, in some embodiments described herein, can be coupled to the sense amplifiers and can be used in combination with the sense amplifiers to sense, store (e.g., cache and buffer), perform compute functions (e.g., operations) on, and/or move data. The I/O circuitry 144 can be used for bi-directional data communication with host 110 over the data bus 156 (e.g., a 64 bit wide data bus). The write circuitry 148 can be used to write data to the memory array 130.

Controller 140 (e.g., bank control logic and sequencer) can decode signals (e.g., commands) provided by control bus 154 from the host 110. These signals can include chip enable signals, write enable signals, and/or address latch signals that can be used to control operations performed on the memory array 130, including data sense, data store, data movement, data compute (PIM), data read, data write, data erase, and/or random number generation operations, among other operations. Control circuitry having instructions (e.g., stored in hardware, such as an application-specific integrated circuit (ASIC), firmware, and/or software embodiments) can be associated with the controller 140. For example, random number generation, as described herein, can be controlled by a random number component 172 that, in some embodiments, may be associated with the controller 140 (e.g., of a bank). In various embodiments, the controller 140 can be responsible for issuing instructions from the host 110 and accessing the memory array 130. The controller 140 can be a state machine, a sequencer, or some other type of controller. The controller 140 can control shifting data (e.g., right or left) in a row of an array (e.g., memory array 130).

Examples of the sensing circuitry 150 are described further below (e.g., in connection with FIGS. 2A-2B). For instance, in various embodiments, the sensing circuitry 150 can include a number of sense amplifiers and/or a number of compute components. A compute component may serve as an accumulator and can be used to perform operations as directed by a controller 140 and/or a respective subarray controller (not shown) of each subarray (e.g., on data associated with complementary sense lines). In some embodiments, a compute component can be coupled to each sense amplifier (e.g., as shown at 231 and 206, respectively, in FIG. 2B) within the sensing circuitry 150 in each respective sensing component stripe coupled to a subarray (e.g., in sensing component stripes 124-0 and 124-1 coupled respectively to subarrays 125-0 and 125-1 shown in and described in connection with FIG. 1B). However, embodiments are not so limited. For example, in some embodiments, there may not be a 1:1 correlation between the number of sense amplifiers and compute components. For example, there may be more than one sense amplifier per compute component or more than one compute component per sense amplifier, which may vary between subarrays, banks, etc.

In a number of embodiments, the sensing circuitry 150 can be used to perform operations using data stored in memory array 130 as input and participate in movement of the data for reading, writing, logical, copy and/or transfer, and storage operations to a different location in the memory array 130 without transferring the data via a sense line address access (e.g., without firing a column decode signal). As such, various compute functions (PIM operations) can be performed using, and within, the sensing circuitry 150 rather than (or in association with) being performed by processing resources external to the sensing circuitry 150 (e.g., by a processor associated with host 110 and other processing circuitry, such as ALU circuitry, located on device 120, such as on controller 140 or elsewhere). Moreover, random number generation, as described herein, may be performed using the sense amplifier of the sensing circuitry to sense a residual voltage at a pair of complementary memory cells each coupled at corresponding positions on a respective pair of sense lines.

In various previous approaches, data associated with an operand, for instance, would be read from memory via sensing circuitry and provided to external ALU circuitry via I/O lines (e.g., via local I/O lines and global I/O lines). The external ALU circuitry could include a number of registers and would perform compute functions using the operands, and the result would be transferred back to the array via the I/O lines.

In contrast, as described herein, sensing circuitry 150 is configured to perform operations on data stored in memory array 130 and to store the result back to the memory array 130 without enabling a local I/O line and global I/O line coupled to the sensing circuitry 150. The sensing circuitry 150 can be formed on pitch with the memory cells of the array. Additional peripheral sense amplifiers and/or logic 170 (e.g., subarray controllers that each execute instructions for performing a respective operation) can be coupled to the sensing circuitry 150. The sensing circuitry 150 and the peripheral sense amplifier and logic 170 can cooperate in performing operations, according to some embodiments herein.

Logic, as described herein, is intended to mean hardware (e.g., in the form of an application specific integrated circuit (ASIC)) and/or firmware to implement one or more particular functions. One example of logic may include a state machine, as described herein. Another example may include an embedded processing resource. Logic can include instructions (e.g., PIM commands and/or microcode instructions) that can be sent to a memory device having processing capabilities to implement logical operations. As such, the logic may be associated with (e.g., located at and/or connected to) the host 110, the controller 140, and/or the memory array 130 (e.g., at logic 170).

Hence, in a number of embodiments, circuitry external to memory array 130 and sensing circuitry 150 is not needed to perform compute functions, as the sensing circuitry 150 can perform the appropriate operations in order to perform such compute functions (e.g., in a sequence of instructions) without the use of an external processing resource. Therefore, the sensing circuitry 150 may be used to complement or to replace, at least to some extent, such an external processing resource (or at least reduce the bandwidth consumption of transfer of data to and/or from such an external processing resource).

In a number of embodiments, the sensing circuitry 150 may be used to perform operations (e.g., to execute a sequence of instructions) in addition to operations performed by an external processing resource (e.g., host 110). For example, either of the host 110 and the sensing circuitry 150 may be limited to performing only certain operations and/or a certain number of operations.

Enabling a local I/O line and/or global I/O line can include enabling (e.g., turning on, activating) a transistor having a gate coupled to a decode signal (e.g., a column decode signal) and a source/drain coupled to the I/O line. However, embodiments are not limited to not enabling a local I/O line and/or global I/O line. For example, in a number of embodiments, the sensing circuitry 150 can be used to perform operations without enabling column decode lines of the array. However, the local I/O line(s) and/or global I/O line(s) may be enabled in order to transfer a result to a suitable location other than back to the memory array 130 (e.g., to an external register).

Figure 1B:
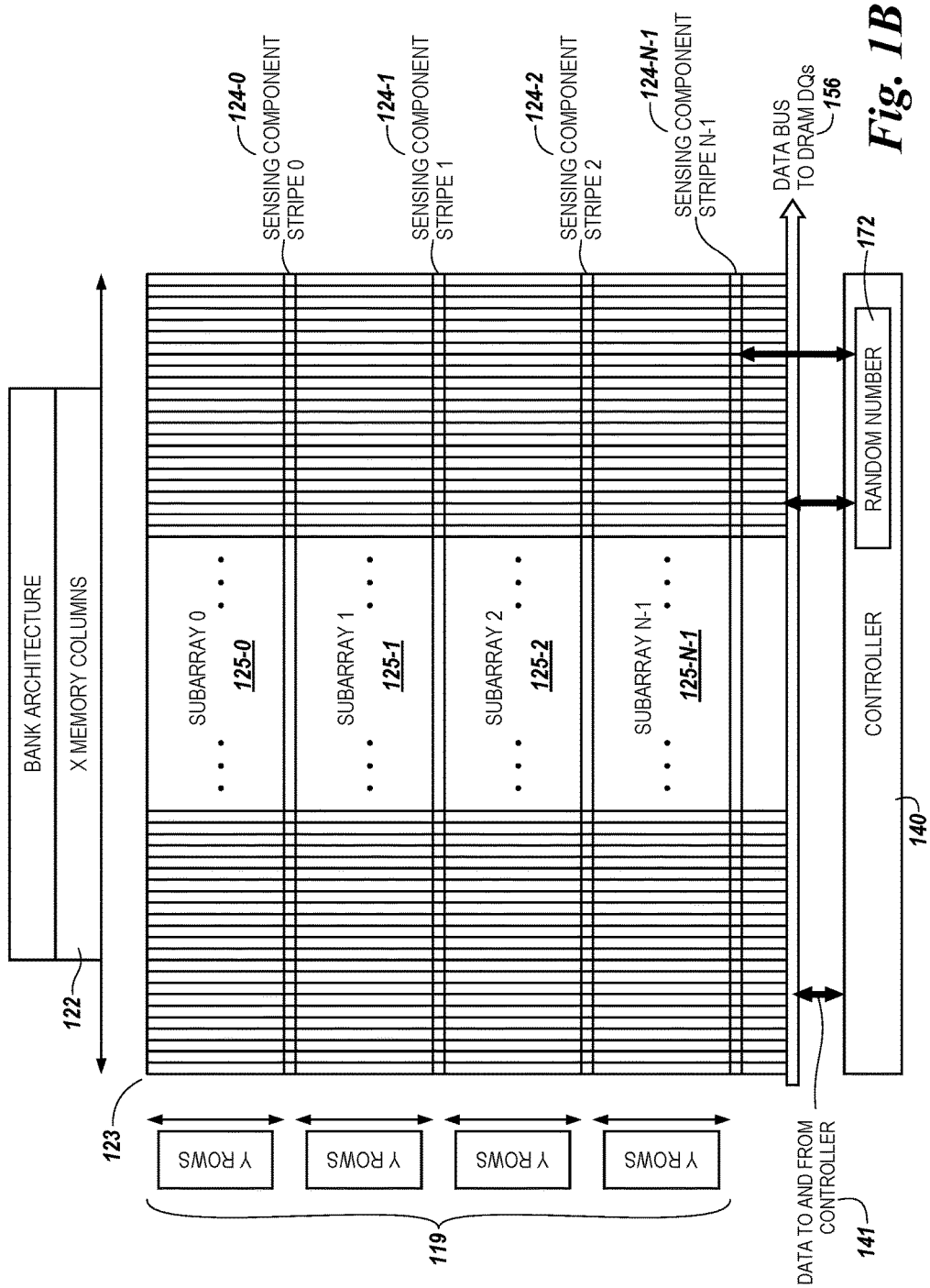
FIG. 1B is a block diagram of a bank section of a memory device in accordance with a number of embodiments of the present disclosure.

FIG. 1B is a block diagram of a bank section 123 of a memory device in accordance with a number of embodiments of the present disclosure. For example, bank section 123 can represent an example section of a number of bank sections of a bank of a memory device (e.g., bank section 0, bank section 1, . . . , bank section M−1). As shown in FIG. 1B, a bank section 123 can include a plurality of memory columns 122 shown horizontally as X (e.g., 4096, 8192, or 16,384 columns, among various possibilities) in an example DRAM bank and bank section. Additionally, the bank section 123 may be divided into subarray 0, subarray 1, . . . , and subarray N−1 (e.g., 32, 64, or 128 subarrays, among various possibilities) shown at 125-0, 125-1, . . . , 125-N−1, respectively, that are separated by amplification regions configured to be coupled to a data path. As such, the subarrays 125-0, 125-1, . . . , 125-N−1 can each have amplification regions 124-0, 124-1, . . . , 124-N−1 that correspond to sensing component stripe 0, sensing component stripe 1, . . . , and sensing component stripe N−1, respectively.

Each column 122 (e.g., each pair of sense or digit lines) is configured to be coupled to sensing circuitry 150, as described in connection with FIG. 1A and in more detail in connection with FIGS. 2A-2B and FIG. 3. As such, each column in a subarray can be coupled individually to a sense amplifier that contributes to a sensing component stripe for that subarray. For example, as shown in FIG. 1B, the bank section 123 can include sensing component stripe 0, sensing component stripe 1, . . . , sensing component stripe N−1 that each have sensing circuitry 150 with sense amplifiers that can, in various embodiments, be used as registers, cache and/or data buffering and that are coupled to each column 122 in the subarrays 125-0, 125-1, . . . , 125-N−1.

Each of the of the subarrays 125-0, 125-1, . . . , 125-N−1 can include a plurality of rows 119 shown vertically as Y (e.g., each subarray may include 256, 512, 1024 rows, among various possibilities) in an example DRAM bank. Embodiments are not limited to the example horizontal and vertical orientation of columns and rows described herein or the example numbers thereof. Each of the plurality of rows 119 can include pairs of complementary memory cells, for example as shown in and described in connection with FIG. 3. Each of the complementary memory cells of the pair can be coupled to one of a respective pair of sense lines at a position of the row on the sense lines. As such, the number of memory cells in a row can correspond to the number of sense lines that intersect that row, which may be double the number of columns, as described herein. For example, there may be 8192, 16,384, or 32,768 memory cells in the 4096, 8192, or 16,384 complementary pairs of memory cells in a row that intersects 4096, 8192, or 16,384 columns, among various possibilities, in an example DRAM bank and bank section.

The portions of the sensing circuitry 150 can be separated between a number of sensing component stripes 124 that are each physically associated with a subarray 125 of memory cells in a bank section 123, as shown in FIG. 1B. The sense amplifiers may sense data values stored in memory cells of the subarrays and/or the sense amplifiers may sense residual voltages on the sense lines. The residual voltages on the sense lines may be sensed following selectably coupled memory cells being equilibrated (e.g., with $V_{DD}/2$) via the corresponding sense lines. The sense amplifiers may amplify the sensed data value voltages and/or the sensed residual voltages to full rail voltages for conversion of the sensed voltages from a pair of complementary memory cells to a data unit (e.g., a binary 0 or 1 data value) by determination of a voltage differential for either a read or a random number generation operation, among other possible operations. In some embodiments, the sense amplifiers may at least temporarily store (e.g., cache) sensed data units. The compute components may, in some embodiments, perform compute operations on the cached data units in the plurality of sensing component stripes 124. The plurality of sensing component stripes 124 may each be physically associated with a subarray 125 of memory cells in the bank section 123, as shown in FIG. 1B.

As shown in FIG. 1B, the bank section 123 can be associated with controller 140. The controller 140 shown in FIG. 1B can, in various examples, represent at least a portion of the functionality embodied by and contained in the controller 140 shown in FIG. 1A. The controller 140 can direct (e.g., control) input of commands and data 141 to the bank section 123 and/or output (e.g., movement) of data from the bank section 123 (e.g., to the host 110), along with control of random number generation in the bank section 123 by the random number component 172, as described herein. The bank section 123 can include the data bus 156 (e.g., a 64 bit wide data bus) to DRAM DQs, which can correspond to the data bus 156 shown and described in connection with FIGS. 1A and 1B. Each data bus 156 for each bank of subarrays (e.g., 125-0, 125-1, . . . , 125-N−1) can be referred to as a portion of a data bus that contributes to formation of a combined data bus (e.g., for a plurality of banks and/or memory devices). As such, in some embodiments, eight 64 bit wide data bus portions for eight banks can contribute to a 512 bit wide combined data bus. Alternatively or in addition, each bank can individually use the entirety of the 512 bit wide combined data bus, although one bank at a time. Various combinations of using the data bus portions also may be utilized. For example, one bank may use four data bus portions at the same time as four other banks each use one of the remaining four data bus portions, among other possibilities.

FIG. 2A is a schematic diagram illustrating sensing circuitry 250-1 in accordance with a number of embodiments of the present disclosure. FIG. 2A shows a sense amplifier 206 coupled to a respective pair of complementary sense lines 205-1 and 205-2. The sense amplifier 206 shown in FIG. 2A can correspond to a plurality of sense amplifiers in the sensing circuitry 150 shown in FIG. 1A and/or the sensing circuitry 150 associated with the plurality of sensing component stripes 124 shown in FIG. 1B, for example.

As shown and described in connection with FIG. 3, complementary memory cells are coupled to pairs of complementary sense lines 205-1 and 205-2 (e.g., as columns) shown in FIG. 2A. For example, a memory cell can comprise a transistor and a capacitor. The memory cells can be, for example, 1T1C DRAM cells each comprising a storage element (e.g., a capacitor) and an access device (e.g., a transistor), although other configurations can be used (e.g., 2T2C with two transistors and two capacitors per memory cell). In a number of embodiments, the memory cells may be destructive read memory cells (e.g., reading the data stored in the cell destroys the data such that the data originally stored in the cell may be refreshed after being read). The cells of the memory array can be arranged in rows coupled by access lines and columns coupled by pairs of complementary sense lines, for example, DIGIT(n−1)/DIGIT(n−1)_, DIGIT(n)/DIGIT(n)_, DIGIT(n+1)/DIGIT(n+1)_. The individual sense lines corresponding to each pair of complementary data lines can also be referred to as sense lines 205-1 (D) and 205-2 (D_) respectively. Although only three pairs of complementary sense lines (e.g., three columns) are shown in FIG. 3, embodiments of the present disclosure are not so limited. For example, an array of memory cells can include additional columns of memory cells and/or sense lines (e.g., 4,096, 8,192, 16,384, etc.).

Memory cells can be coupled to different sense lines and/or access lines. For example, a first source/drain region of an access transistor of a memory cell can be coupled to a sense line 205-1 (D), a second source/drain region of the access transistor of the memory cell can be coupled to a capacitor of the memory cell, and a gate of the access transistor of the memory cell can be coupled to an access line of the memory array.

As shown in FIG. 2A, the sensing circuitry 250-1 can comprise a sense amplifier 206 corresponding to a respective column of memory cells (e.g., coupled to respective pairs of complementary sense lines). The sense amplifier 206 can comprise, for example, a cross coupled latch, which can be referred to herein as a primary latch. A data storage state can include the sense amplifiers 206 storing a data unit. As used herein, a data unit can be referred to as a bit and/or a digit value.

In a number of examples, the sense amplifier 206 (or a compute component 231 as shown in and described in connection with FIG. 2B) can be in at least one of two states associated with the first mode and the second mode. As used herein, a state of a sense amplifier 206 can describe a transfer of data to or from the sense amplifier 206. The state of the sense amplifier 206 can also be described as whether the sense amplifier 206 is in an equilibration state or is storing a data unit (e.g., a binary 0 or 1 data value). For example, a sense amplifier can be configured to be in an initial state, wherein the initial state is one of an equilibration state and a data storage state.

According to various embodiments, a sense amplifier 206 can comprise a cross coupled latch. However, embodiments of the sense amplifier 206 are not limited to a cross coupled latch. For example, the sense amplifier 206 in FIG. 2A can be current-mode sense amplifier and/or single-ended sense amplifier (e.g., sense amplifier coupled to one data line). Embodiments of the present disclosure also are not limited to a folded data line architecture.

In a number of embodiments, a sense amplifier 206 can comprise a number of transistors formed on pitch with the transistors of a corresponding compute component (e.g., compute component 231 shown and described in connection with FIG. 2B) and/or the memory cells of an array (e.g., memory array 130 shown in FIG. 1A and/or memory cells 302/303 shown in FIG. 3) to which they are coupled, which may conform to a particular feature size (e.g., $4F^2$, $6F^2$, etc.). Sense amplifier 206 comprises a latch 215 including four transistors coupled to a pair of complementary sense lines D 205-1 and D_ 205-2. The latch 215 can be a cross coupled latch. For example, the gates of a pair of transistors, such as n-channel transistors (e.g., NMOS transistors) 227-1 and 227-2 can be cross coupled with the gates of another pair of transistors, such as p-channel transistors (e.g., PMOS transistors) 229-1 and 229-2. As described further herein, the latch 215 comprising transistors 227-1, 227-2, 229-1, and 229-2 can be referred to as a primary latch. However, embodiments are not limited to this example.

The voltages and/or currents on the respective sense lines 205-1 and 205-2 can be provided to the respective latch inputs 233-1 (S1) and 233-2 (S2) of the cross coupled latch 215 (e.g., the input of the primary latch). In this example, the latch input 233-1 is coupled to a first source/drain region of transistors 227-1 and 229-1 as well as to the gates of transistors 227-2 and 229-2. Similarly, the latch input 233-2 can be coupled to a first source/drain region of transistors 227-2 and 229-2 as well as to the gates of transistors 227-1 and 229-1.

In this example, a second source/drain region of transistors 227-1 and 227-2 can be commonly coupled to a negative control signal (RnlF) 228. A second source/drain region of transistors 229-1 and 229-2 can be commonly coupled to an active positive control signal (ACT) 265. The ACT signal 265 can be a supply voltage (e.g., $V_{DD}$) and the RnlF signal can be a reference voltage (e.g., ground). RnlF signal 228 and ACT signal 265 can function as activating signals that enable the cross coupled latch 215.

The enabled cross coupled latch 215 can operate to amplify a differential voltage between latch input 233-1 (e.g., first common node) and latch input 233-2 (e.g., second common node) such that latch input 233-1 is driven to one of the ACT signal voltage and the RnlF signal voltage (e.g., to one of $V_{DD}$ and ground), and latch input 233-2 is driven to the other of the ACT signal voltage and the RnlF signal voltage. The ACT signal voltage and the RnlF signal voltage may correspond to the full rail voltages for conversion of the sensed voltages from the pair of complementary memory cells to a data unit (e.g., a binary 0 or 1 data value) by determination of the voltage differential for either a read or a random number generation operation, among other possible operations.

The sense amplifier 206 may also include equilibrate circuitry 214 configured to equilibrate sense line 205-1 and sense line 205-2 in association with, for example, preparing the sense amplifier for a logical operation and/or a random number generation operation. In this example, the equilibrate circuitry 214 comprises a transistor 224 having a first source/drain region coupled to a first source/drain region of transistor 225-1 and sense line 205-1. A second source/drain region of transistor 224 can be coupled to a first source/drain region of transistor 225-2 and sense line 205-2. A gate of transistor 224 can be coupled to gates of transistors 225-1 and 225-2.

The second source drain regions of transistors 225-1 and 225-2 can be coupled to an equilibration voltage 238, which can be equal to $V_{DD}/2$, where $V_{DD}$ is a supply voltage associated with the array. The gates of transistors 224, 225-1, and 225-2 can be coupled to control signal 226 (EQ). As such, activating EQ can enable the transistors 224, 225-1, and 225-2, which can effectively short sense line 205-1 to sense line 205-2. Shorting the sense lines as such may substantially equilibrate the sense lines 205-1 and 205-2 to the equilibration voltage $V_{DD}/2$. However, as described herein, a small residual voltage differential may remain between the complementary sense lines 205-1 and 205-2, which may be sensed at the complementary memory cells coupled to the complementary sense lines in a row of the array by the corresponding sense amplifier 206. In some embodiments, the residual voltage differential itself and/or variance in direction of the differential with time may result from, or be contributed to by, thermal noise causing random agitation of charge carriers in sense line 205-1 and sense line 205-2.

The sense amplifier 206 may also include compensate circuitry 271. The compensate circuitry 271 shown in FIG. 2A can, in various examples, represent at least a portion of the functionality embodied by and contained in the compensate circuitry 171 shown in FIG. 1A. The compensate circuitry 271 is configured to compensate for an inherent offset in the sense amplifier 206 and/or the respective sense lines 205-1 and 205-2 that may affect the sensed differential of the residual voltage (e.g., a magnitude of the differential).

As described herein, the sense amplifier 206 may be enabled (e.g., fired) to sense and/or store voltage potentials from two complementary memory cells coupled to adjacent sense lines 205-1 and 205-2, which may be on both sides of the sense amplifier 206. An inherent offset may be a resistance and/or a capacitance that is not equal on both sides of the sense amplifier 206. Variance in the resistance and/or capacitance may be caused by variation in construction and/or connection (e.g., within or exceeding manufacturing tolerances) of the sense lines and/or other circuitry of the memory array. An intended unbalanced layout and/or unintended process variations may result in resistance and/or capacitance that varies between both sides of the sense amplifier 206. Such variation may cause, for example, threshold voltages to vary several millivolts from transistor to transistor. For example, threshold voltages for NMOS transistors 227-1 and 227-2 and/or PMOS transistors 229-1 and 229-2 may be affected such that the performance of the sense amplifier 206 may be impaired (e.g., defective). Accordingly, the compensate circuitry 271 may be utilized to at least partially compensate (correct) such effects on the sense amplifier 206.

In the embodiment illustrated in FIG. 2A, the compensate circuitry 271 is split into a first portion 271-1 on the left side of the sense amplifier 206 and a second portion 271-2 on the right side. However, embodiments are not so limited. For example, the compensate circuitry 271 may be configured as a single portion on the left side or the right side of the sense amplifier 206, among other possible locations, to compensate the variation in resistance and/or capacitance.

In embodiments with the split portions of the compensate circuitry, each portion 271-1, 271-2 of the compensate circuitry can include a respective transistor 217-1, 217-2 (e.g., an NMOS transistor) and a respective capacitor 218-1, 218-2. In some embodiments, portion 271-1 can be coupled to sense line 205-1 and latch input 233-1 and portion 271-2 can be coupled to sense line 205-2 and latch input 233-2 of the cross coupled latch 215 of the sense amplifier 206. However, embodiments are not so limited in that the compensate circuitry 271 may be otherwise coupled to the sensing circuitry 250-1.

A compensate signal 290-1, 290-2 may be input to one or both portions of the compensate circuitry 271-1, 271-2. The compensate signals 290-1, 290-2 may be used to tune the sense amplifier 206 by effectively adding more resistance and/or capacitance to one side (e.g., via the respective sense line and/or the respective latch input) or the other side of the sense amplifier 206. Biasing the resistance and/or capacitance of one side may be implemented by applying a particular analog voltage level to either transistor 217-1, 217-2 and/or the respective capacitor 218-1, 218-2. The added resistance and/or capacitance could counteract inherent offsets of the sense amplifier 206, sense lines 205-1 and 205-2, and/or other circuitry connected to the sense amplifier or sense lines. Alternatively or in addition, a sense amplifier gain can be changed by adjusting a DC supply voltage higher or lower to which the sense lines are equilibrated (e.g., $V_{DD}/2$).

In some embodiments, when all sense amplifiers are determined and/or are assumed to have the same or similar inherent offsets, compensate signals may be connected in common to all the sense amplifiers in a memory array 130. The compensate signals 290-1, 290-2 may be sent from a source external to the memory array 130 (e.g., by the controller 140 and/or the random number component 172 thereof). As such, the compensate signals may be similar to the RnIF signal 228, the ACT signal 265, and/or the EQ signal 226.

Figure 2B:
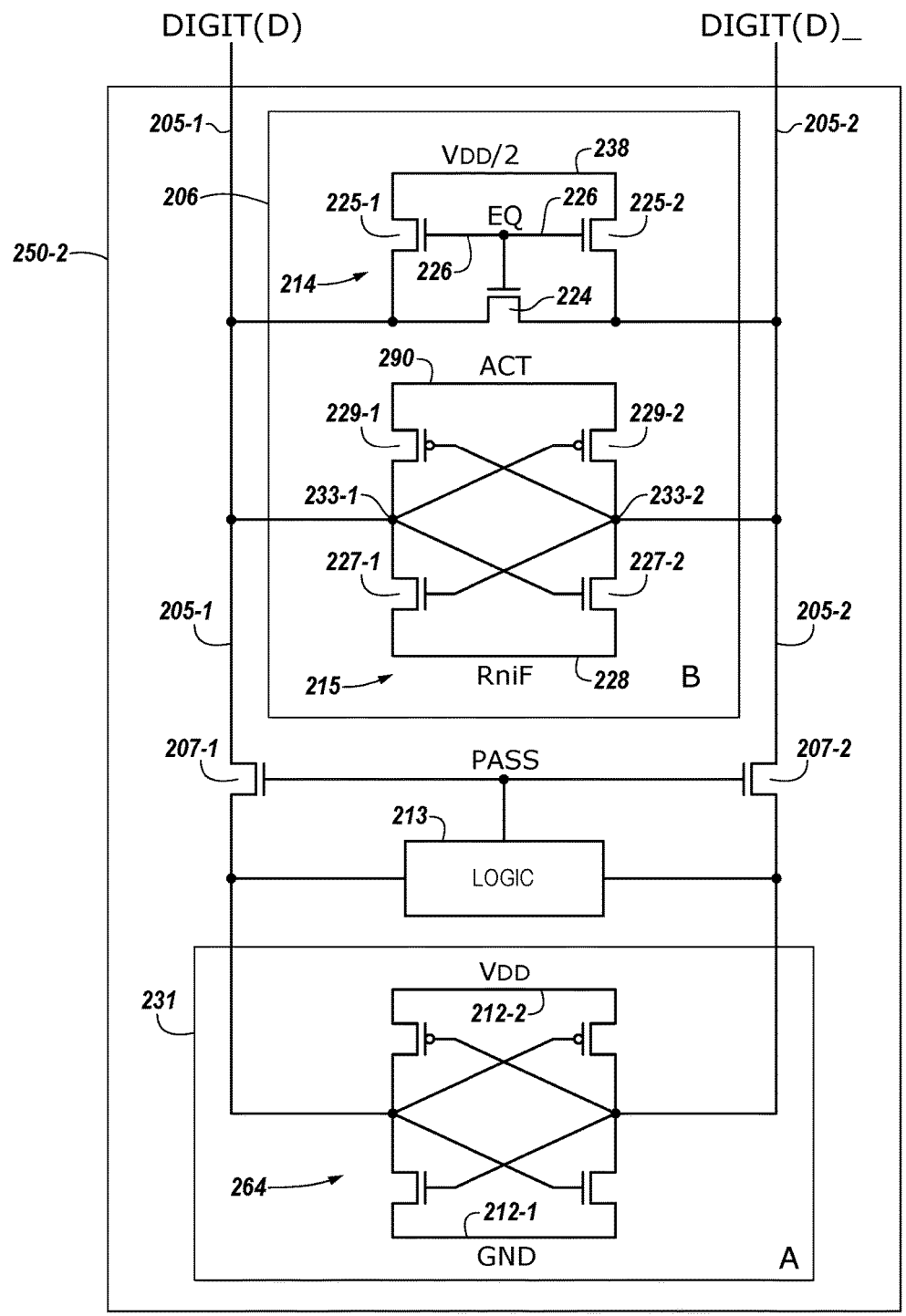

FIG. 2B is another schematic diagram illustrating sensing circuitry 250-2 in accordance with a number of embodiments of the present disclosure. FIG. 2B indicates that a number of sense amplifiers 206 can be coupled to respective pairs of complementary sense lines 205-1 and 205-2, and a corresponding number of compute components 231 can be coupled to the sense amplifiers 206 via pass gates 207-1 and 207-2. The sense amplifier 206 and compute component 231 shown in FIG. 2B can correspond to sensing circuitry 150 shown in FIG. 1A and/or the sensing circuitry 150 associated with the plurality of sensing component stripes 124 shown in FIG. 1B, for example. The sensing circuitry 250-2 shown in FIG. 2B includes logical operation selection logic 213, which can be operated as described further below. For purposes of clarity, the configuration shown in FIG. 2B does not include the compensate circuitry 271 illustrated in FIG. 1A. However, in various embodiments, compensate circuitry may be incorporated into the configuration shown in FIG. 2B.

As shown in FIG. 2B, the sensing circuitry 250-2 can comprise a sense amplifier 206, a compute component 231, and logical operation selection logic 213 corresponding to a respective column of memory cells (e.g., coupled to respective pairs of complementary sense lines). The sense amplifiers 206 can be configured, for example, as described with respect to FIG. 2A. The sensing circuitry 250-2 can be operated in both a pre-sensing mode (e.g., sense amplifiers 206 fired before logical operation control signal active) and post-sensing mode (e.g., sense amplifiers 206 fired after logical operation control signal active) with a result of a logical operation performed by the compute component 231 being initially stored in the sense amplifier 206.

As shown in FIG. 2B, the compute component 231 can comprise a latch, which can be referred to herein as a secondary latch 264. The secondary latch 264 can be configured and operated in a manner similar to that described above with respect to the primary latch 215. In some embodiments, a pair of cross coupled p-channel transistors (e.g., PMOS transistors) included in the secondary latch can have their respective sources coupled to a supply voltage 212-2 (e.g., $V_{DD}$), and the pair of cross coupled n-channel transistors (e.g., NMOS transistors) of the secondary latch can have their respective sources selectively coupled to a reference voltage 212-1 (e.g., ground), such that the secondary latch 264 may be continuously enabled. In a number of embodiments, the secondary latch 264 of the compute component 231 can serve as an accumulator. As such, the compute component 231 can operate as and/or may be referred to herein as an accumulator. The configuration of the compute component 231 is not limited to that shown in FIG. 2B, and various other embodiments are feasible within the scope of the present disclosure.

The gates of the pass gates 207-1 and 207-2 can be controlled by a logical operation selection logic signal, Pass. For example, an output of the logical operation selection logic 213 can be coupled to the gates of the pass gates 207-1 and 207-2.

Data units present on the pair of complementary sense lines 205-1 and 205-2 can be loaded into the compute component 231 via the pass gates 207-1 and 207-2. When the pass gates 207-1 and 207-2 are OPEN, data units on the pair of complementary sense lines 205-1 and 205-2 may be passed to the compute component 231. The data unit on the pair of complementary sense lines 205-1 and 205-2 can be the data unit stored at least temporarily in the sense amplifier 206 when the sense amplifier is enabled (e.g., fired). The logical operation selection logic signal, Pass, is activated to OPEN (e.g., turn on) the pass gates 207-1 and 207-2.

The control signals can operate to select a logical operation to implement based on the data unit ("B") in the sense amplifier 206 and the data unit ("A") in the compute component 231 (e.g., as used herein, the data unit stored in a primary latch of a sense amplifier is referred to as a "B" data unit, and the data unit stored in a secondary latch of a compute component is referred to as an "A" data unit). In particular, the control signals may be configured to select the logical operation (e.g., function) to implement independent from the data unit present on the pair of complementary sense lines 205-1 and 205-2, although the result of the implemented logical operation can be dependent on the data unit present on the pair of complementary sense lines 205-1 and 205-2.

Although not shown in FIG. 2B, each column of memory cells can be coupled to a column decode line that can be activated to transfer, via a local I/O line, a data unit from a corresponding sense amplifier 206 and/or compute component 231 to a control component external to the array such as an external processing resource (e.g., host processor and/or other functional unit circuitry). The column decode line can be coupled to a column decoder (e.g., column decoder 152 in FIG. 1A). However, as described herein, data need not be transferred via such I/O lines to perform logical operations. For example, circuitry can be operated in conjunction with sense amplifiers 206 and compute components 231 to perform logical and/or random number generation operations without transferring data to a control component external to the array. As used herein, transferring data can include, for example, moving data from a source location to a destination location without necessarily maintaining a copy of the data at the source location.

In operation, a data unit on a pair of complementary sense lines (e.g., 205-1/205-2) can be loaded into a corresponding compute component 231 (e.g., by operating logical operation selection logic as described above). For example, a data unit can be loaded into a compute component 231 via overwriting of the data unit currently stored in the compute component 231 with the data unit stored in the corresponding sense amplifier 206.

The sensing circuitry 250-2 in FIG. 2B can be operated in several modes to perform logical (e.g., PIM) operations, including a first mode in which a result of the logical operation is initially stored in the sense amplifier 206, and a second mode in which a result of the logical operation is initially stored in the compute component 231. For example, if the sense amplifier 206 is equilibrated and the control signals are activated to provide a conduction path (e.g., electrical continuity) between the sense amplifier 206 and the compute component 231, then a data unit stored in the compute component 231 can be transferred from the compute component 231 to the sense amplifier 206. If the sense amplifier 206 is configured to store a first bit (e.g., first data unit) and the control signals are activated to provide a conduction path between the sense amplifier 206 and the compute component 231, then a second bit (e.g., second data unit) that is stored in the compute component 231 before the activation of the control signals can be replaced by the first bit and the sense amplifier 206 retains the first bit. Furthermore, a number of PIM operations can be performed using the first bit and the second bit using the logical operation selection logic and the result of the operation can be stored in the compute component 231.

As described herein, the sense amplifier 206 can, in some embodiments in conjunction with the compute component 231, be operated to perform various logical operations and/or operations involving random number generation (e.g., using data and/or residual voltages from an array as input). In a number of embodiments, the result of a logical operation and/or operation involving random number generation can be stored back to the array without transferring the data via a data line address access (e.g., without firing a column decode signal such that data is transferred to circuitry external to the array and sensing circuitry via local I/O lines). As such, a number of embodiments of the present disclosure can enable performing various PIM operations (e.g., logical operations, shift operations, mathematical operations, data movement operations using shared I/O lines) and/or operations involving random number generation, etc., using less power than various previous approaches. Additionally, because a number of embodiments can reduce or eliminate moving (e.g., copying, transferring) data across I/O lines in order to perform operations (e.g., between memory and a discrete processor, which may be off pitch), a number of embodiments may enable an increased parallel processing capability as compared to previous approaches.

Figure 3:
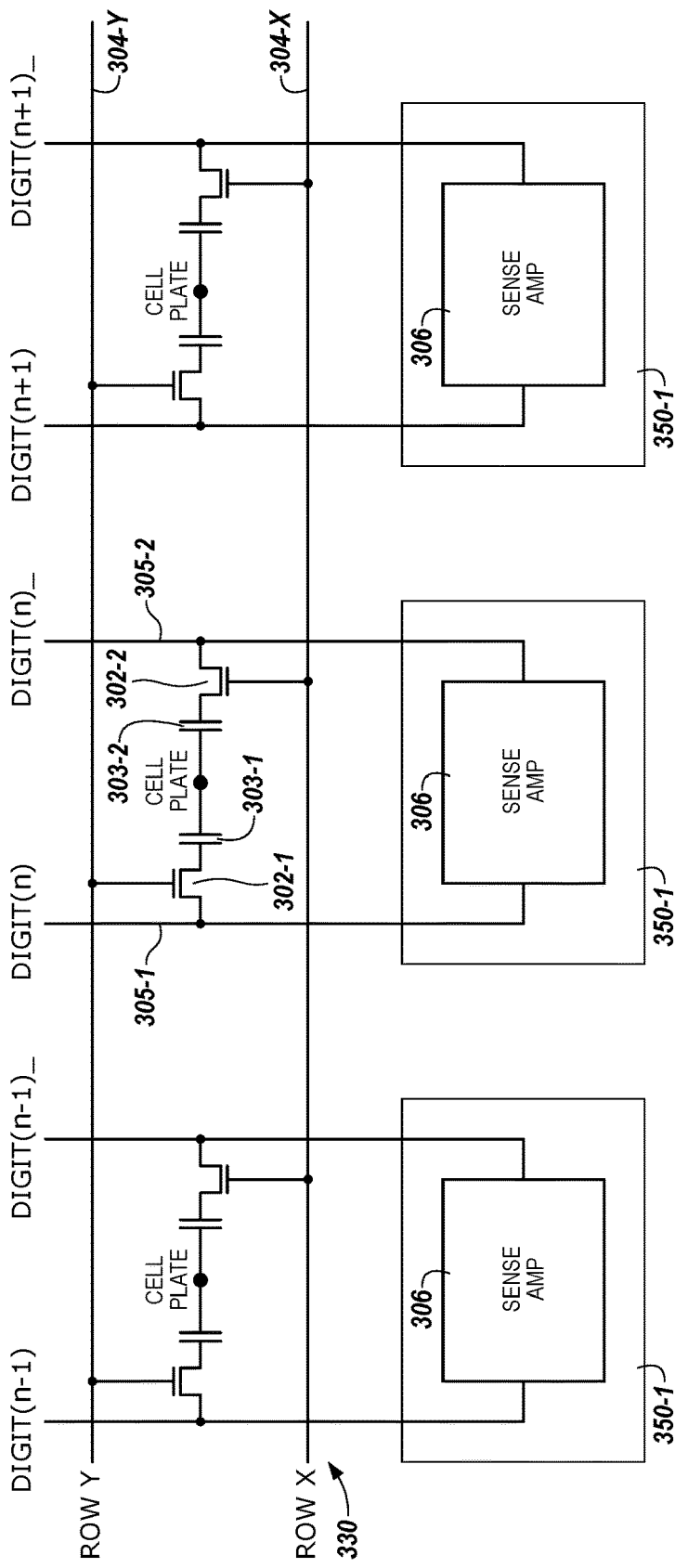
FIG. 3 is a schematic diagram of a memory device in accordance with a number of embodiments of the present disclosure.

FIG. 3 is a schematic diagram of a memory device in accordance with a number of embodiments of the present disclosure. In the embodiment illustrated in FIG. 3, the memory array 330 is an array, for example a DRAM array, of 1T1C (one transistor one capacitor) memory cells that can each include an access device 302 (e.g., a transistor) and a storage element 303 (e.g., a capacitor). Some embodiments, however, can, for example, include 2T2C memory cells and/or other array configurations. The memory cells of the memory array 330 can be arranged in rows (as shown at 119 and described in connection with FIG. 1B) coupled by access lines 304-X (Row X), 304-Y (Row Y), etc., and columns coupled by pairs of complementary sense lines DIGIT(n−1)/DIGIT(n−1)_, DIGIT(n)/DIGIT(n)_, and DIGIT(n+1)/DIGIT(n+1)_, etc. The individual sense lines corresponding to each pair of complementary data lines can be referred to as sense lines 305-1 (DIGIT(n)) and 305-2 (DIGIT(n)_) respectively. Although only three pairs of complementary sense lines are shown in FIG. 3, embodiments of the present disclosure are not so limited, and an array of memory cells may include additional columns of memory cells and/or sense lines (e.g., 4,096, 8,192, 16,384, etc.).

As shown in FIG. 3, a gate of a particular memory cell transistor 302 can be coupled to its corresponding access line 304-X, 304-Y, etc., a first source/drain region can be coupled to its corresponding data line (e.g., 305-1 (DIGIT (n), 305-2 (DIGIT(n)_)), and a second source/drain region of a particular memory cell transistor can be coupled to its corresponding capacitor 303.

Memory cells can be coupled to different sense lines and/or access lines. For example, a first source/drain region of a transistor 302-1 can be coupled to sense line 305-1, a second source/drain region of transistor 302-1 can be coupled to capacitor 303-1, and a gate of a transistor 302-1 can be coupled to access line 304-Y. A first source/drain region of transistor 302-2 can be coupled to sense line 305-2, a second source/drain region of transistor 302-2 can be coupled to capacitor 303-2, and a gate of a transistor 302-2 can be coupled to access line 304-X. The cell plate, as shown in FIG. 3, can be coupled to each of capacitors 303-1 and 303-2. The cell plate can be a common node to which a reference voltage (e.g., ground) can be applied in various memory array configurations.

As described herein, the transistors 302 and capacitors 303 can contribute to formation of the pairs of complementary memory cells in a single row of the memory array that are coupled to the complementary sense lines (e.g., sense lines 305-1 and 305-2). The number of data values (e.g., voltages) sensed from the memory cells in logical operations and/or random number generation operations may correspond to the number of columns of memory cells and/or pairs of sense lines (e.g., 4,096, 8,192, 16,384, etc.) that intersect a row, for example, of a subarray 125 shown in and described in connection with FIG. 1B. In various embodiments, each subarray may include 256, 512, 1024 rows, among other possible numbers of rows, and each bank section may be divided into 32, 64, or 128 subarrays, among various possibilities.

The memory array 330 illustrated in FIG. 3 is coupled to sensing circuitry 350 in accordance with a number of embodiments of the present disclosure. In some embodiments, the sensing circuitry 350-1 may include a sense amplifier 306 corresponding to respective columns of memory cells (e.g., coupled to respective pairs of complementary data lines 305-1, 305-2) but does not additionally include a compute component (e.g., 231 shown in FIG. 2B). However, embodiments are not so limited. For example, some embodiments of the sensing circuitry 350-2 (not shown) may include a compute component that can perform compute and/or accumulator functionalities. The sensing circuitry 350 can correspond to sensing circuitry 150 shown in FIG. 1A and/or described in connection with the sensing component stripes 124 in FIG. 1B, for example.

The sense amplifier 306 can correspond to sense amplifier 206 described previously with respect to FIGS. 2A-2B. The sense amplifier 306 can be operated to determine a data value stored in (e.g., a logic state) and/or a residual voltage at a selected memory cell, which may be represented by the voltages present on the complementary sense lines 305-1, 305-2.

Figure 4A:
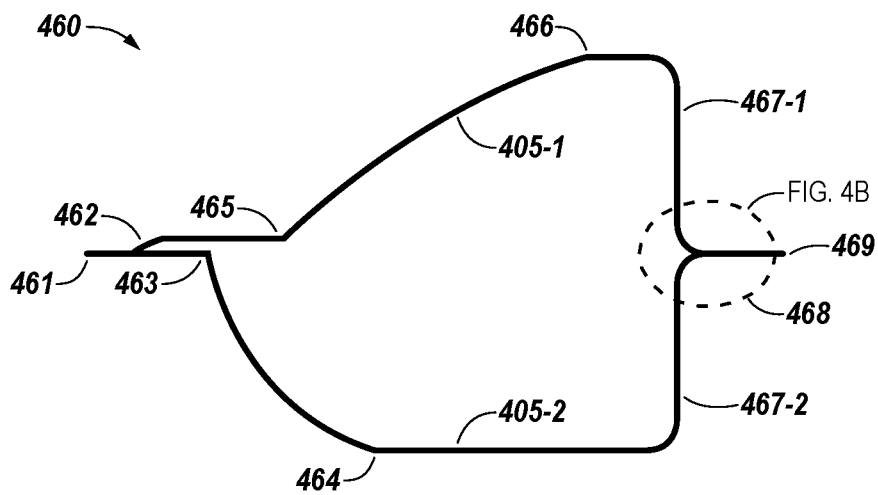
FIGS. 4A-4B illustrate waveform diagrams showing signals on sense lines corresponding to a number of logical operations and random number generation operations in accordance with a number of embodiments of the present disclosure.
Figure 4B:
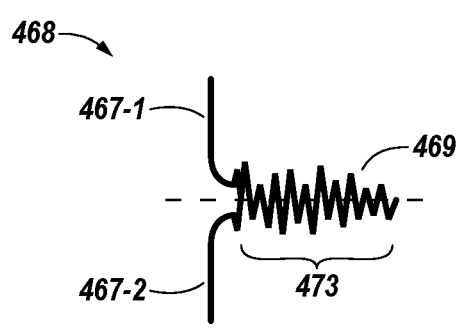

FIGS. 4A-4B illustrate waveform diagrams showing signals on sense lines corresponding to a number of logical operations and random number generation operations in accordance with a number of embodiments of the present disclosure. In performance of various logical operations (e.g., read, write, and/or Boolean compute operations, among others) using a memory array (e.g., having DRAM memory cells), a sequence of events for accessing the memory cells of a row can occur as illustrated in the waveform 460 shown in FIG. 4A.

For example, before a row of memory cells is accessed (e.g., fired) for performance of the logical operation, the voltage of sense lines 405-1 and 405-2 may be at essentially the same voltage 461 (e.g., $V_{DD}/2$). To access the row of memory cells, that row can be selected and/or opened 462 (e.g., fired by execution of a fire row command). The firing 462 of the row may introduce a small voltage differential between the sense lines 405-1 and 405-2 that may be sensed (e.g., at complementary memory cells coupled to the sense lines) by a coupled sense amplifier.

As shown in FIG. 4A, a memory cell coupled to sense line 405-1 can be programmed to hold a positive voltage that can be sensed by operating (firing) 465 the sense amplifier and amplified 466 to a full rail voltage (e.g., $V_{DD}$) that indicates a logical value (e.g., data unit) of 1 in binary, for example. In contrast, in this example, a complementary memory cell coupled to sense line 405-2 can remain in a low voltage state so as to hold the original voltage 461 (e.g., $V_{DD}/2$), which can be sensed by operating (firing) 463 the coupled sense amplifier and amplified 464 to a full rail voltage (e.g., ground) indicative of voltage not being elevated at the complementary memory cell. The original small voltage differential will determine the data value (e.g., data unit) sensed at the sense amplifier after the sense amplifier is fired.

At the end of a row cycle (e.g., reading the data values stored by some or all of the memory cells of the row), the sense lines 405-1 and 405-2 can have their voltages equilibrated 467-1, 467-2. The sense lines 405-1 and 405-2 can have their voltages equilibrated by both sense lines having their voltages equilibrated to essentially the same voltage 469 (e.g., $V_{DD}/2$), as described in connection with the equilibrate circuitry 214 shown in and described in connection with FIG. 2A.

FIG. 4B illustrates a magnified waveform 468 corresponding to the equilibrated portion of the waveform shown at the right side of FIG. 4A. Although an equilibration operation may equalize the voltages of both sense lines to essentially the same voltage 469 when viewed and/or analyzed on a large scale, such as shown in FIG. 4A, variations between the sense lines (e.g., differences in composition, thickness, length, conductance, and/or resistance, among other factors) may contribute to the sense lines not being brought to exactly the same voltage. Moreover, the voltages of the sense lines may vary randomly due to electronic noise (e.g., thermal noise) causing the residual voltage at each of the pair of complementary memory cells after equilibration to randomly vary with passage of time. For example, the random variations of the residual voltage in the complementary sense lines may cause the small scale residual voltage differentials 469 that vary with the passage of time 473 shown in FIG. 4B.

As described herein, prior to programming memory cells and/or following the equilibration operation and prior to firing of a row for a next cycle, the voltage differential between the sense lines is not exactly at 0.0 V. Various sources of entropy may contribute to electronic noise in electrical conductors of the sensing circuitry 150 and/or the memory array 130. A major contribution may be due to thermal noise present on the sense lines 405-1 and 405-2 and/or output of the transistors 227-1, 227-2, 229-1, and 229-2 of the sense amplifiers 206. Such thermal noise may be modeled with the following equation:

$$\overline{v_{ds}^2} = \frac{4\gamma kT \Delta f}{g_{ds}}$$

where $\overline{v_{ds}^2}$ is a mean square of voltage variance per hertz of bandwidth between a drain (d) and a source (s), $g_{ds}$ is the reciprocal of the resistance between d and s and is measured in siemens, k is Boltzmann's constant in joules per kelvin, T is the absolute temperature in degrees kelvin, $\Delta f$ is the bandwidth in hertz over which the noise is measured, and $\gamma$ is a value chosen to fit a noise measurement to improve accuracy of the noise model.

Due to the random nature of the thermal noise entropy, residual voltage differentials will be non-deterministic and, hence, can be used to produce random data units (e.g., of either 0 or 1 in binary) at the sense amplifier. Because the small scale residual voltage differentials 469 between the complementary sense lines may randomly vary in a positive direction or negative direction at any point in time, sensing and amplifying the residual voltage differentials with a sense amplifier can yield a data unit (e.g., 0 or 1 in binary) that randomly varies (e.g., between 0 or 1) at any point in time. Moreover, combining a plurality of data units determined from residual voltage differentials of a plurality of complementary memory cells in a row may yield a vector of random data units with a length that corresponds to a number of pairs of complementary memory cells sensed by the respective sense amplifiers.

In some embodiments, a sense operation may be performed to determine a residual voltage differential on the first sense line and a complimentary second sense line in a range of 15-45 millivolts, whereas a read operation of a memory cell of a row may be performed to determine a voltage differential of a programmed data unit in a range of 50-100 millivolts. For example, as shown in FIG. 4A, the residual voltage differential may be sensed by the sense amplifier in a lower voltage (potential) range than the potential range used by the sense amplifier for sensing a voltage differential of a programmed data unit. A lowest millivolt value in the residual voltage differential range may be greater than a highest millivolt value in a range of inherent offsets for memory cells, sense lines, and/or sense amplifiers of the DRAM array or may be adjusted accordingly by compensate circuitry (e.g., as shown at 271 and described in connection with FIG. 2A).

Figure 5:
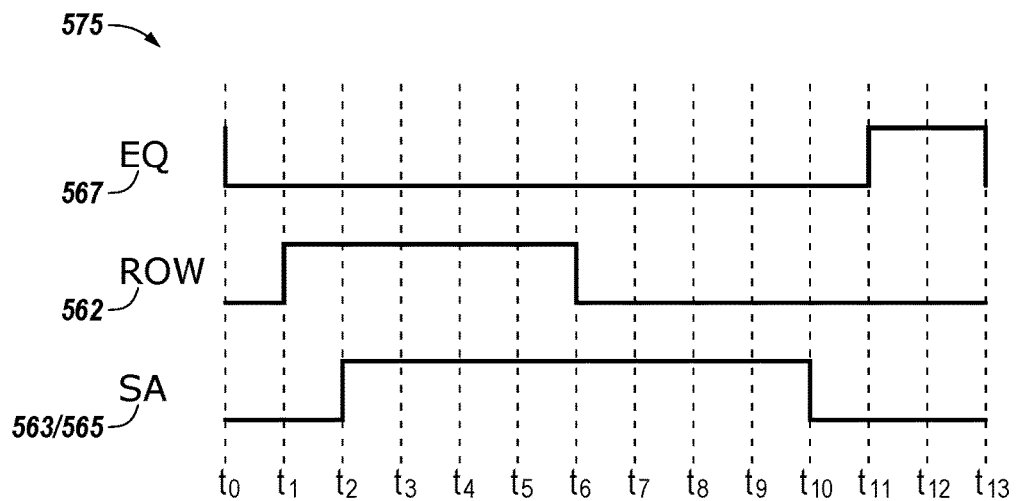
FIG. 5 illustrates a timing diagram associated with performing a number of logical operations using sensing circuitry in accordance with a number of embodiments of the present disclosure.

FIG. 5 illustrates a timing diagram associated with performing a number of logical operations using sensing circuitry in accordance with a number of embodiments of the present disclosure. In an array memory cells, for example, a DRAM array, a sequence of events, including the row cycle and random number generation operations described in connection with FIGS. 4A-4B, can be directed by a series of fine-tuned operations. The series of operations may be sent to the DRAM array at specific times determined by instructions issued by, for example, a state machine and/or a timing component thereof, as described herein.

FIG. 5 illustrates a timing diagram 575 associated with performance of the various logical operations (e.g., read, write, and/or Boolean compute operations, among others) in the row cycle using circuitry in accordance with that described in connection with the left side of FIG. 4A and elsewhere herein. The timing diagram 575 schematically illustrated in FIG. 5 is shown as an example of a sequence of signals in circuitry for the various logical operations. A time scale horizontally demarcated in signaling unit time points ($t_0, t_1, t_2, \ldots, t_{13}$) of arbitrary length is shown by way of example.

At $t_0$, a pair of complementary sense lines may be in an equilibration state 567. At $t_1$, the row of memory cells may be selected and/or opened 562 (e.g., fired) to introduce a small voltage differential between the sense lines, as shown at 462 in FIG. 4A. At $t_2$, a sense amplifier may be fired 563, 565 to determine a voltage differential between the sense lines at a position of complementary memory cells in the row. As shown by comparison of the waveforms 460, 468 in FIGS. 4A-4B, firing of the row at 562 would overwhelm the residual voltage of the sense lines 405-1 and 405-2 so as to prevent the residual voltage differential at complementary memory cells from being sensed by a coupled sense amplifier. The residual voltage differential at the complementary memory cells may remain overwhelmed until bringing the row of memory cells back to the equilibration state 567 starting at $t_{10}$.

Figure 6:
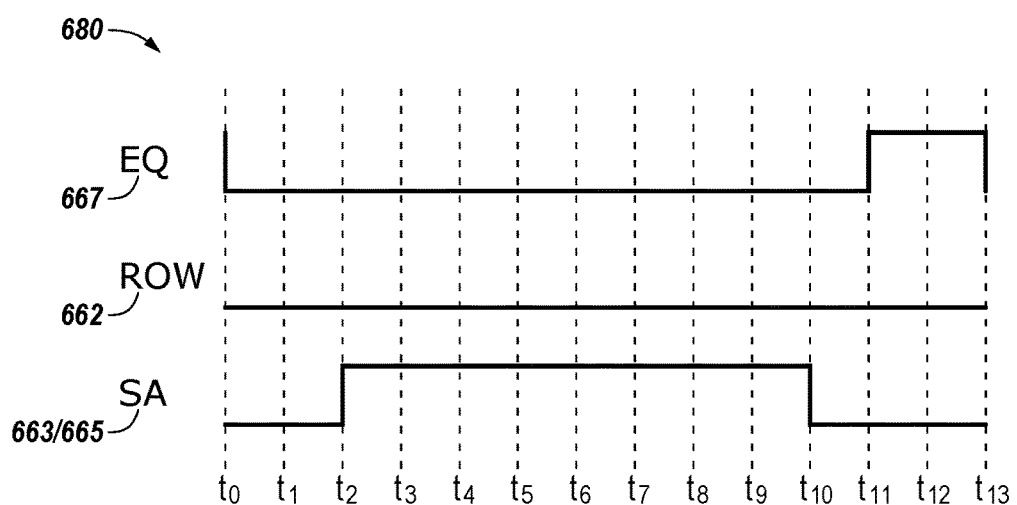
FIG. 6 illustrates a timing diagram associated with performing a number of random number generation operations using sensing circuitry in accordance with a number of embodiments of the present disclosure.

FIG. 6 illustrates a timing diagram 680 associated with performing a number of random number generation operations using sensing circuitry in accordance with a number of embodiments of the present disclosure. As just described, performance of the various logical operations in the row cycle may render voltages and differentials thereof resulting from electronic (e.g., thermal) noise negligible when the row is fired.

As such, the present disclosure describes issuing by the state machine and/or the timing component thereof a sequence of instructions to the row that does not include instructions for performance of the row fire operation. This can be accomplished by modifying the sequence of instructions sent to the DRAM array.

Hence, at $t_0$ a pair of complementary sense lines may be in an equilibration state 667. In contrast to the row cycle described in connection with FIG. 5, at $t_1$ and throughout the row cycle shown in FIG. 6, the row of memory cells may remain unselected and/or unopened 662 (e.g., unfired). At $t_2$, a sense amplifier may be fired 663, 665 to determine a voltage differential between the sense lines at a position of complementary memory cells in the row. In this way, the electronic (thermal) noise may enable the residual voltages of the sense lines and the differential thereof to be sensed by the fired sense amplifier between a first sense line and a complimentary second sense line in the array, for example, following a previous equilibration operation. Executing this modified sequence of instructions may enable generation of a random data value (e.g., 0 or 1 in binary) at $t_2$, as shown in FIG. 6. However, in various embodiments, a random data value may be generated at any of the time points $t_0$, $t_1$, $t_2$, ..., $t_{10}$ in the modified row cycle at which the sense amplifier is fired 663, 665 following placing the pair of complementary sense lines in an equilibration state 667 at $t_{11}$, $t_{12}$, $t_{13}$, for example.

Since the modified sequence of instructions may be written such that the modified series of operations for the row cycle may apply to sense amplifiers corresponding to an entire row of memory cells, the same series of operations may be used to produce a number of random data units corresponding to a length of the entire row. Since the length of an element within a vector of random data units may depend only on how that vector is addressed, a hardware, firmware, and/or software application may use this set of random data units as a vector containing up to W/L elements of random data units, where W is the width of the row in the array in data units and L is a desired length of the element in data units.

In some memory array configurations, physical properties (e.g., inherent offsets for sense lines, memory cells, and/or sense amplifiers of a DRAM array) may be such that a residual voltage differential following an equilibration operation may be difficult to determine in order to produce the random data unit upon firing of the sense amplifier. The compensate circuitry 271 shown in and described in connection with FIG. 2A is designed to at least partially overcome such difficulties.

Embodiments described herein provide a method of operating an apparatus that may be in the form of a computing system 100 including a memory device 120 (e.g., as shown in and described in connection with FIGS. 1A-3) for random number generation. As described herein, the method can include operating the memory device for random number generation by operating a sense amplifier (e.g., sense amplifier 206 in FIG. 2A-2B and/or 306 in FIG. 3) of the memory device to perform sensing a first voltage on a first sense line (e.g., sense line 205-1 shown in FIGS. 2A-2B and at corresponding reference numbers on FIGS. 3 and 4A) coupled to the sense amplifier and sensing a second voltage on a complementary second sense line (e.g., sense line 205-2 shown in FIGS. 2A-2B and at corresponding reference numbers on FIGS. 3 and 4A) coupled to the sense amplifier. The method can include generating a random number by detecting a voltage differential between the first sense line and the complementary second sense line.

In some embodiments, an equilibration operation can be performed such that the first voltage on the first sense line and the second voltage on the complementary second sense line are both in an equilibration state. As such, for example, a sense line 305-1 coupled to a memory cell (e.g., the memory cell shown at 302-1, 303-1 in FIG. 3) and a sense line 305-2 coupled to a paired memory cell (e.g., the memory cell shown at 302-2, 303-2 in FIG. 3) can be placed in the equilibrated state. The equilibration operation can be performed, for example, using the equilibrate circuitry 214 to equilibrate sense line 205-1 and sense line 205-2 shown in and described in connection with FIGS. 2A-2B. Performance of the equilibration operation can bring the voltages of the sense lines and/or memory cells to essentially the same residual voltage (e.g., close to $V_{DD}/2$ as shown at 469 and described in connection with FIG. 4A).

The method can include sensing a first residual voltage on the first sense line and a second residual voltage on the complementary second sense line to detect the voltage differential to generate the random number. The first residual voltage and the second residual voltage may, as described herein, result from electronic noise (e.g., thermal noise) in an electrical conductor (e.g., sense lines 205-1, 205-2, a sense amplifier 206, and/or a compute component 231 shown in and described in connection with FIGS. 2A-2B). For example, a differential may be generated in the first residual voltage and the second residual voltage by residual voltages being unequal in the first sense line (e.g., sense line 305-1) and the second sense line (e.g., sense line 305-2). Performance of the equilibration operation can result in the residual voltages being unequal in the first sense and the second sense line (e.g., as shown at 469 and described in connection with FIG. 4B). The unequal residual voltages can be due to, or at least contributed to, thermal noise that enables random agitation of charge carriers in the first sense line and the second sense line.

As described herein, a random data unit can be generated from the detection of the voltage differential between the first sense line and the complementary second sense line and a random number can be generated utilizing the random data unit. As described herein, a residual voltage differential can be determined on a first sense line and a complementary second sense line using a sense amplifier selectably coupled to the respective pair of complementary sense lines. The random data unit can, in some embodiments, be generated by performing an equilibration operation on a pair of complementary sense lines of a DRAM array. The random data unit may be determined based on the determined residual voltage differential. In some embodiments, the random data unit may be stored in the sense amplifier that determined residual voltage differential. In some embodiments, the random data unit may be moved for storage in a pair of complementary memory cells of a row of the DRAM array. The random number may be generated, in some embodiments, by a processor (e.g., random number component 172 shown in and described in connection with FIGS. 1A-1B) by accessing the random data unit from the sense amplifier and/or the memory cell in which the random data unit is stored.

As shown at 662 and described in connection with FIG. 6, a random number generation operation may leave a row unselected and/or unopened (e.g., unfired) for a programming operation (e.g., a logical operation as described in connection with FIG. 5) prior to using sense amplifier to perform the sense operation to determine the residual voltage differential for random number generation. Leaving the row unfired for the random number generation operation may include a state machine and/or a timing component thereof issuing a sequence of instructions (e.g., microcode) that differs from instructions issued to direct performance of the logical operation.

Performing the random number generation operation may include determining a residual voltage differential on each of respective pairs of complementary sense lines (e.g., as shown at 305-1 and 305-2 in FIG. 3). For example, as shown in and described in connection with FIG. 3, a single sense amplifier 306 can be selectably coupled to each respective pair of complementary memory cells (e.g., via the sense lines 305-1, 305-2). By performing the sense operation on each of respective pairs of complementary sense lines, a vector of data units may be generated with a length that corresponds to a number of pairs of complementary sense lines of the DRAM array (e.g., the number of pairs of complementary sense lines intersecting a row of the DRAM array).

The vector of data units that corresponds to a number of pairs of complementary sense lines may be divided, for example, by a processor (e.g., random number component 172) into a plurality of vector elements (e.g., W/L elements of random data units). Hence, a plurality of random numbers may be generated from the plurality of vector elements, which may be generated from a single vector of data units. Each of the random numbers may include a selected plurality of data units in the vector elements. For example, all of the random numbers may have the same number of data units (digits) by selecting four (e.g., 2761, 9842, 1068, etc.) as the plurality of data units in the vector elements. In some embodiments, the number of data units (digits) can vary between the vector elements and, thus, the random numbers.

As shown at 469 and 473 and described in connection with FIG. 4B, a first residual voltage differential may be determined at a first time by a first sense operation performed on the first sense line and the complementary second sense line to yield a first random data unit. A second residual voltage differential may be determined at a second time by a second sense operation performed on the first sense line and the complementary second sense line to yield a second random data unit. The first random data unit may be different from the second random data unit due to electronic noise causing the residual voltage on the first sense line and the complementary second sense line to randomly vary with passage of time.

Various apparatus configurations may be used for performance of random number generation operations, as described herein. At least one embodiment of such an apparatus may include a DRAM memory cell array 130 with sensing circuitry 150 coupled to the array (e.g., as shown and described in connection with FIGS. 1A-1B). The sensing circuitry 150 can include a sense amplifier (e.g., as shown at 206 and described in connection with FIGS. 2A-2B and at corresponding reference numbers in FIG. 3) coupled to a respective sense line (e.g., as shown at 205-1 and 205-2 and described in connection with FIGS. 2A-2B and at corresponding reference numbers in FIG. 3). The sensing circuitry 150 can be configured to perform random number generation operations and DRAM logical operations (e.g., read and write operations, and Boolean operations, among others). The sensing circuitry 150 may further include equilibrate circuitry (e.g., as shown at 214 and described in connection with FIGS. 2A-2B) configured to equilibrate complementary programmed memory cells selectably coupled to the complementary sense lines in the array, which also become equilibrated.

A random number component 172 (e.g., a processing resource associated with and/or connected to the controller 140 described in connection with FIGS. 1A-1B) can be coupled to the array and sensing circuitry. The random number component 172 may be configured to generate a random number from a residual voltage differential sensed by the sense amplifier on complementary sense lines, as described herein. The random number component 172 may generate the random number from the residual voltage differential of the equilibrated complementary sense lines. The residual voltage differential may at least partially be enabled by random electronic noise in the respective sense lines, with the random number generation being based on the residual voltage differential.

In some embodiments, the random number component 172 can include logic, for example, hardware (e.g., in the form of ASIC) and/or firmware to implement one or more particular functions. As such, the random number component and/or the logic may be configured to receive a request for a random number generation operation and to execute coded instructions (e.g., microcode to initiate the performance of the random number generation operation). The coded instructions may be included and/or associated with a state machine to control the performance of the random number generation operations and/or the DRAM operation by the sensing circuitry. For example, the controller 140 of a memory device 120 may include control circuitry that, in some embodiments, can include control logic and a state machine (e.g., an atomic state machine). The state machine may include and/or be associated with a timing component. The logic may be configured to, for example, receive requests for performance of random number generation operations and DRAM logical operations and execute coded machine instructions to initiate performance of different sequences and/or timing of operations dependent upon whether the request is for performance of a random number generation operation or a DRAM logical operation, as described with regard to FIGS. 5 and 6. The coded machine instructions can be, for example, microcode instructions.

In some embodiments, the sensing circuitry may further include a compute component (e.g., as shown at 231 and described in connection with FIG. 2B) coupled to a respective sense amplifier 206. The compute component may be configured to utilize the random number generated from the residual voltage differential sensed by the sense amplifier in performance of a logical operation. Such a logical operation may include the DRAM logical operations described herein. Alternatively or in addition, such a logical operation may include the previously described examples of applications that use random number samples, among other possibilities. In various embodiments, the sensing circuitry 250, the compensate component 271, and/or the random number component 172 may be formed on pitch with the memory cells in the array 130.

A plurality of complementary memory cells can be included in a row of a memory cell array (e.g., as shown and described in connection with FIG. 3). The sensing circuitry (e.g., 250, 350) may be selectably coupled to the plurality of complementary memory cells via a plurality of columns (e.g., as shown at 122 and described in connection with FIG. 1B). A column can correspond to a pair of complementary of sense lines coupled to corresponding complementary memory cells (e.g., as shown in FIG. 3). The sensing circuitry can include a respective plurality of sense amplifiers (e.g., 215) and equilibrate circuitry (e.g., 214) coupled to a respective plurality of pairs of complementary of sense lines.

A controller 140 can be selectably coupled to the row of the plurality of memory cells and the sensing circuitry and can be configured to issue a command for generation of random numbers based on the residual voltage differentials sensed by the plurality of sense amplifiers on the plurality of complementary sense lines. In some embodiments, a random number component 172 may be associated with and/or connected to the controller 140. The random number component 172 may be operatively coupled to the sensing circuitry and configured to generate a random number from the residual voltage differential sensed by the sense amplifier at the complementary memory cells. The random number component 172 may be further configured to generate a vector of data units with a length that corresponds to a number of the plurality of complementary memory cells in the row. For example, the random number component 172 may be configured to generate a vector of data units with a length that corresponds to a number of the random the random data units generated from the residual voltage differentials sensed by a respective plurality of sense amplifiers (e.g., where the residual voltage differential sensed by each sense amplifier may be used to generate a single data unit for the vector).

The controller 140 may be further configured to issue a command to generate a plurality of vector elements by division of the vector of data units. For example, the number of the data units in the vector may correspond to a number of the plurality of complementary sense lines that intersect the row and a number of the plurality of vector elements may correspond to the number of the data units in the vector divided by a selected length in data units of each vector element. As described in connection with FIG. 6, the controller 140 (e.g., or a state machine and/or a timing component associated with and/or connected to the controller) may be further configured to issue a command to prevent selection of the row (e.g., as shown at 662 and described in connection with FIG. 6) for a programming operation prior to selectably coupling the sensing circuitry to perform a random number generation operation.

While example embodiments including various combinations and configurations of sensing circuitry, sense amplifiers, compute components, equilibrate circuitry, random number components, control circuitry (e.g., including control logic, a sequencer, a timing component, etc.), and/or compensate circuitry, etc., have been illustrated and described herein, embodiments of the present disclosure are not limited to those combinations explicitly recited herein. Other combinations and configurations of the sensing circuitry, sense amplifiers, compute components, equilibrate circuitry, random number components, control circuitry (e.g., including control logic, a sequencer, a timing component, etc.), and/or compensate circuitry, etc., disclosed herein are expressly included within the scope of this disclosure.

Although specific embodiments have been illustrated and described herein, those of ordinary skill in the art will appreciate that an arrangement calculated to achieve the same results can be substituted for the specific embodiments shown. This disclosure is intended to cover adaptations or variations of one or more embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the one or more embodiments of the present disclosure includes other applications in which the above structures and processes are used. Therefore, the scope of one or more embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A system, comprising:
   a host; and
   a memory device coupled to the host; and wherein:
      wherein the memory device is configured to, responsive to a command received from the host, issue a sequence of instructions to a memory array of the memory device to generate a vector of random data units in respective sense amplifiers of the memory array; and
      the vector of random data units is generated without activating a row of the memory array.

2. The system of claim 1, wherein generation of the vector of random data units is based on residual voltages sensed by the sense amplifiers on respective pairs of complementary sense lines of the memory array.

3. The system of claim 1, wherein the memory device is further configured, responsive to the command, to provide the generated vector of random values to the host.

4. The system of claim 1, wherein the host:
   is located external to the memory device; and
   comprises a processor configured to execute an application that uses one or more vectors of random data units generated by the memory device.

5. The system of claim 1, wherein the memory device is further configured to:
   generate the vector of random data units in the respective sense amplifiers; and perform
   processing in memory (PIM) logical operations by a compute component coupled to a sense amplifier.

6. The system of claim 1, wherein:
   a sense amplifier of the memory array is selectably coupled to an array of memory cells on the memory device; and
   responsive to the sequence of instructions, the sense amplifier is configured to:
      sense a residual first voltage on a first sense line coupled to the sense amplifier; and
      sense a residual second voltage on a complementary second sense line coupled to the sense amplifier.

7. The system of claim 1, wherein the memory device is further configured to:
   generate a random data unit from detection of a residual voltage differential between a first sense line and a complementary second sense line; and
   generate a random number utilizing the random data unit.

8. A system, comprising:
   an array of memory cells on a memory device; and
   a host configured to provide a plurality of address signals for a corresponding plurality of sense amplifiers of the array to perform a sequence of operations to generate a vector of random data units in the plurality of addressed sense amplifiers;
   wherein, responsive to a command provided by the host, the memory device is configured to:
      divide the vector of random data units that corresponds to a number of pairs of complementary sense lines of the array into a plurality of vector elements; and
      generate a plurality of random numbers from the plurality of vector elements;
   wherein each of the plurality of random numbers is a selected plurality of random data units in the vector elements.

9. The system of claim 8, wherein the plurality of addressed sense amplifiers is configured to:
   determine, for each of the plurality of address signals, a residual voltage differential on a sense line and a complementary sense line coupled to the array by an addressed sense amplifier coupled to the sense line and the complementary sense line; and
   enable determination of a plurality of random data units corresponding to the plurality of addressed sense amplifiers based on a respective plurality of residual voltage differentials determined by the plurality of addressed sense amplifiers.

10. The system of claim 8, wherein the memory device is configured to:
   determine, by a first addressed sense amplifier, a first residual voltage differential by a first sense operation performed on the corresponding sense line and complementary sense line to yield a first random data unit; and
   determine, by a second addressed sense amplifier, a second residual voltage differential by a second sense operation performed on the corresponding sense line and complementary sense line to yield a second random data unit.

11. The system of claim 8, wherein the memory device is configured to:
   determine a residual voltage differential on each of respective pairs of complementary sense lines of the array; and generate a vector of random data units with a length that corresponds to an addressed number of pairs of complementary sense lines.

12. A method of operating a system, comprising:
receiving, by a memory device, a command from a host for performance of a random number generation operation;
coupling, responsive to the command, sensing circuitry to a plurality of complementary sense lines that corresponds to a respective plurality of complementary memory cells in a row of an array on the memory device;
directing sensing circuitry of the memory device to sense a residual voltage differential between a first sense line and a complementary second sense line that are to be coupled to the sensing circuitry;
generating a random number from the residual voltage differential sensed by the sensing circuitry; and
generating a vector of random data units, for the random number, with a length that corresponds to the respective plurality of complementary memory cells in the row.

13. The method of claim 12, further comprising the memory device directing generation of random numbers, responsive to the command, based on residual voltage differentials sensed by a plurality of sense amplifiers on a corresponding plurality of complementary sense lines.

14. The method of claim 12, further comprising:
coupling, responsive to the command, the sensing circuitry to a plurality of complementary sense lines on the memory device; and
generating a vector of random data units with a length that corresponds to a number of random data units generated from the residual voltage differentials sensed on the plurality of complementary sense lines by a respective plurality of sense amplifiers in the sensing circuitry.

15. The method of claim 12, further comprising:
coupling, responsive to the command, the sensing circuitry to a plurality of complementary sense lines on the memory device; and
generating, responsive to the command, a plurality of vector elements by division of a vector of random data units that corresponds to a number of the plurality of coupled complementary sense lines;
wherein a number of the plurality of vector elements corresponds to the number of the random data units in the vector divided, responsive to the command, by a selected length in random data units of each vector element.

16. The method of claim 12, further comprising preventing, responsive to the command, activation of a row of memory cells on the memory device prior to the complementary sense lines being coupled to the sensing circuitry.

17. The method of claim 12, further comprising:
coupling a sense amplifier to a respective compute component in the sensing circuitry; and
directing, responsive to another command from the host, the compute component to use the random number in performance of a logical operation.

18. A system, comprising:
a host; and
a memory device coupled to the host wherein;
the memory device is configured to, responsive to a command received from the host, issue a sequence of instructions to a memory array of the memory device to generate a vector of random data units in respective sense amplifiers of the memory array;
the vector of random data units is generated without activating a row of the memory array; and
the memory device is further configured to:
generate the vector of random data units in the respective sense amplifiers; and
perform processing in memory (PIM) logical operations by a compute component coupled to a sense amplifier.

19. A system, comprising:
a host; and
a memory device coupled to the host; and wherein:
the memory device is configured to, responsive to a command received from the host, issue a sequence of instructions to a memory array of the memory device to generate a vector of random data units in respective sense amplifiers of the memory array;
a sense amplifier of the memory array is selectably coupled to an array of memory cells on the memory device; and
responsive to the sequence of instructions, the sense amplifier is configured to:
sense a residual first voltage on a first sense line coupled to the sense amplifier; and
sense a residual second voltage on a complementary second sense line coupled to the sense amplifier.

20. A method of operating a system, comprising:
receiving, by a memory device, a command from a host for performance of a random number generation operation;
coupling, responsive to the command, sensing circuitry to a plurality of complementary sense lines on the memory device;
directing the sensing circuitry of the memory device to sense a residual voltage differential between a first sense line and a complementary second sense line coupled to the sensing circuitry;
generating a random number from the residual voltage differential sensed by the sensing circuitry; and
generating a vector of random data units, for the random number, with a length that corresponds to a number of random data units generated from the residual voltage differentials sensed on the plurality of complementary sense lines by a respective plurality of sense amplifiers in the sensing circuitry.

21. A method of operating a system, comprising:
receiving, by a memory device, a command from a host for performance of a random number generation operation;
coupling, responsive to the command, sensing circuitry to a plurality of complementary sense lines on the memory device;
directing the sensing circuitry of the memory device to sense a residual voltage differential between a first sense line and a complementary second sense line coupled to the sensing circuitry;
generating a random number from the residual voltage differential sensed by the sensing circuitry; and
generating, responsive to the command, a plurality of vector elements by division of a vector of random data units that corresponds to a number of the plurality of coupled complementary sense lines;
wherein a number of the plurality of vector elements corresponds to the number of the random data units in the vector divided, responsive to the command, by a selected length in random data units of each vector element.

22. A method of operating a system, comprising:

receiving, by a memory device, a command from a host for performance of a random number generation operation;

coupling, responsive to the command, sensing circuitry to a plurality of complementary sense lines on the memory device;

directing the sensing circuitry of the memory device to sense a residual voltage differential between a first sense line and a complementary second sense line that are coupled to the sensing circuitry;

preventing, responsive to the command, activation of a row of memory cells on the memory device prior to the complementary sense lines being coupled to the sensing circuitry; and generating a random number from the residual voltage differential sensed by the sensing circuitry.

23. A method of operating a system, comprising:

receiving, by a memory device, a command from a host for performance of a random number generation operation;

coupling, responsive to the command, sensing circuitry to a plurality of complementary sense lines on the memory device;

directing the sensing circuitry of the memory device to sense a residual voltage differential between a first sense line and a complementary second sense line coupled to the sensing circuitry;

generating a random number from the residual voltage differential sensed by the sensing circuitry;

coupling a sense amplifier to a respective compute component in the sensing circuitry; and directing, responsive to another command from the host, the compute component to use the random number in performance of a logical operation.

* * * * *